(12) United States Patent
Lim et al.

(10) Patent No.: US 11,917,863 B2
(45) Date of Patent: Feb. 27, 2024

(54) DISPLAY DEVICE AND METHOD OF PROVIDING THE SAME

(71) Applicant: Samsung Display Co., LTD., Yongin-si (KR)

(72) Inventors: Sang Hyung Lim, Cheonan-si (KR); Se Jin Park, Suwon-si (KR); Min Gyu Jang, Seoul (KR); In Hye Heo, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 281 days.

(21) Appl. No.: 17/468,974

(22) Filed: Sep. 8, 2021

(65) Prior Publication Data
US 2022/0231099 A1    Jul. 21, 2022

(30) Foreign Application Priority Data

Jan. 15, 2021 (KR) .................. 10-2021-0005853

(51) Int. Cl.
*H10K 59/122* (2023.01)
*H10K 59/123* (2023.01)
*H10K 71/00* (2023.01)
*H10K 102/10* (2023.01)

(52) U.S. Cl.
CPC ......... *H10K 59/122* (2023.02); *H10K 59/123* (2023.02); *H10K 71/00* (2023.02); *H10K 2102/103* (2023.02)

(58) Field of Classification Search
None
See application file for complete search history.

(56) References Cited

U.S. PATENT DOCUMENTS

2020/0185650 A1*  6/2020  Lim ............... H10K 59/122
2022/0158120 A1*  5/2022  Imabayashi ............ G09F 9/30

FOREIGN PATENT DOCUMENTS

| JP | 2009009708 A | 1/2009 |
| JP | 2016018759 A | 2/2016 |
| KR | 10-0491146 B1 | 5/2005 |
| KR | 1020150029556 A | 3/2015 |
| KR | 1020180061073 A | 6/2018 |
| KR | 10-2009854 B1 | 8/2019 |

OTHER PUBLICATIONS

PCT ISR for PCT/KR2022/000366 dated Jan. 10, 2022.
PCT ISR Written Opinion for PCT/KR2022/000366 dated Apr. 11, 2022.

* cited by examiner

*Primary Examiner* — Michelle Mandala
(74) *Attorney, Agent, or Firm* — CANTOR COLBURN LLP

(57) ABSTRACT

A display device includes a pixel electrode including silver, a pixel-defining film on the pixel electrode and exposing the pixel electrode, a barrier layer on the pixel electrode and the pixel-defining film and including a low-resistance area and a high-resistance area which has a higher resistance than the low-resistance area, an emission layer on the barrier layer, and a common electrode on the emission layer. The low-resistance area of the barrier layer overlaps with the pixel electrode, and the high-resistance area of the barrier layer overlaps with the pixel-defining film.

20 Claims, 15 Drawing Sheets

TA: TA1, TA2, TA3
PXS: PXS_1, PXS_2, PXS_3
EMA: EMA1, EMA2, EMA3

DISPLAY DEVICE AND METHOD OF PROVIDING THE SAME

This application claims priority to Korean Patent Application No. 10-2021-0005853 filed on Jan. 15, 2021 and all the benefits accruing therefrom under 35 U.S.C. § 119, the disclosure of which is incorporated herein by reference in its entirety.

BACKGROUND

1. Field

The disclosure relates to a display device and a method of providing the same.

2. Description of the Related Art

Display devices are becoming more important with developments in multimedia technology. Accordingly, various display devices such as a liquid crystal display ("LCD") device, an organic light-emitting diode ("OLED") display device, and the like have been used.

A self-luminous display device, which is a type of display device, includes self-luminous elements such as OLEDs. Each of the self-luminous elements may include two electrodes facing each other and an emission layer interposed between the two electrodes. In a case where the self-luminous elements are OLEDs, electrons and holes from the two electrodes may recombine together in the emission layer to generate excitons, and light may be emitted in response to the transition of the excitons from an excited state to a ground state.

The self-luminous display device omits a separate light source and can thus be implemented as a low-power consumption, thin, light-weight display device with high-quality characteristics such as wide viewing angles, high luminance and contrast, and a fast response speed, drawing attention as a next-generation display device.

SUMMARY

Embodiments provide a display device capable of improving reliability by suppressing or preventing defects such as dark spots or pixel shrinkage.

However, embodiments are not restricted to those set forth herein. The above and other embodiments of the invention will become more apparent to one of ordinary skill in the art to which the invention pertains by referencing the detailed description of the invention given below.

An embodiment of a display device includes a substrate, a pixel electrode on the substrate and including silver (Ag), a pixel-defining film on the pixel electrode and exposing the pixel electrode, a barrier layer on the pixel electrode and the pixel-defining film and including a low-resistance area and a high-resistance area which has a higher resistance than the low-resistance area, an emission layer on the barrier layer, and a common electrode disposed on the emission layer. The low-resistance area of the barrier layer overlaps with the pixel electrode, and the high-resistance area of the barrier layer overlaps with the pixel-defining film.

An embodiment of a display device includes a substrate, a pixel electrode on the substrate, a pixel-defining film on the pixel electrode and exposing the pixel electrode, a barrier layer on the pixel electrode and the pixel-defining film and including first and second areas which have different resistances from each other, an emission layer on the barrier layer, and a common electrode on the emission layer. The barrier layer includes at least one of indium gallium zinc oxide and indium tin zinc oxide, and the first area of the barrier layer is a n+-doped area of the barrier layer.

An embodiment of a method of providing a display device includes doping a pixel electrode with hydrogen, providing a pixel-defining film which exposes the pixel electrode, on the pixel electrode, providing a barrier layer on part of the pixel electrode exposed by the pixel-defining film and on the pixel-defining film, diffusing hydrogen of the pixel electrode into the barrier layer through thermal treatment, and providing an emission layer on the barrier layer. The barrier layer includes a first area which overlaps with the pixel electrode, and a second area which overlaps with the pixel-defining film, and the first area of the barrier layer has a lower resistance than the second area of the barrier layer.

According to the aforementioned and other embodiments of the invention, the reliability of a display device can be improved by suppressing or preventing defects such as dark spots or pixel shrinkage.

Other features and embodiments may be apparent from the following detailed description, the drawings, and the claims.

BRIEF DESCRIPTION OF THE DRAWINGS

The above and other embodiments and features of the invention will become more apparent by describing in detail embodiments thereof with reference to the attached drawings, in which.

DETAILED DESCRIPTION

Figure 1:
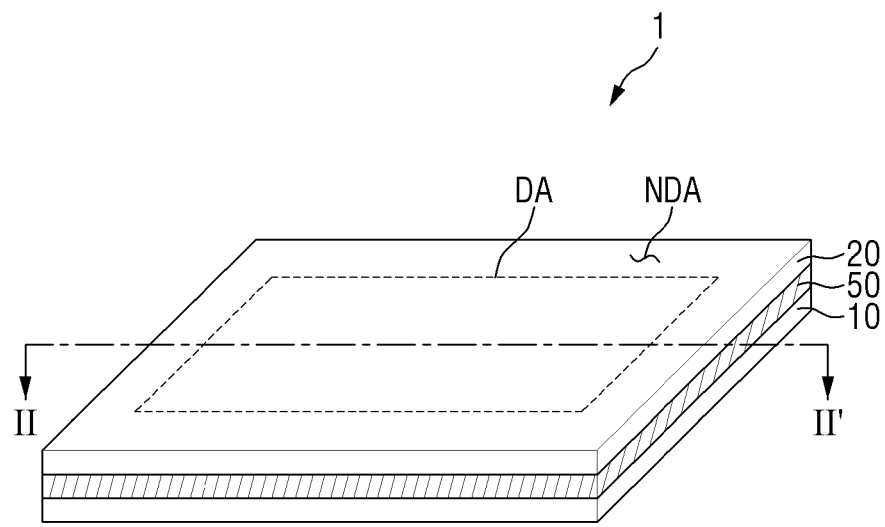
FIG. 1 is a perspective view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being related to another such as being "on" another layer or substrate, it can be directly on the other layer or substrate, or intervening layers may also be present. In contrast, when a layer is referred to as being related to another such as being "directly on" another layer or substrate, no intervening layer is present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings.

FIG. 1 is a perspective view of an embodiment of a display device 1.

Referring to FIG. 1, a display device 1 may refer to nearly all types of electronic devices that provide a display screen at which an image is displayed. Examples of the display device 1 may include a television ("TV"), a notebook computer, a monitor, a billboard, a mobile phone, a smartphone, a tablet personal computer ("PC"), an electronic watch, a smartwatch, a watchphone, a mobile communication terminal, an electronic notepad, an electronic book, a portable multimedia player ("PMP"), a navigation device, a gaming console, a digital camera, and an Internet-of-Things (IoT) device.

The display device 1 may be a television ("TV"). The display device 1 may have a high or ultrahigh resolution (such as High Definition ("HD"), Ultra-High Definition ("UHD"), 4K or 8K), but the invention is not limited thereto.

The display device 1 may have a rectangular shape in a plan view. The planar shape of the display device 1 is not particularly limited, and the display device 1 may be formed (or provided) in a circular shape or another shape.

The display device 1 may include a display area DA which displays an image, and a non-display area NDA which does not display an image. The display area DA may include a pixel PX provided in plural including a plurality of pixels PX. The non-display area NDA is adjacent to the display area DA. In an embodiment, the non-display area NDA may be disposed around (e.g., adjacent) the display area DA and may surround the display area DA. Various layers and components of the display device 1 may include a display area DA and a non-display area NDA corresponding to those described above for the display device 1.

Figure 2:
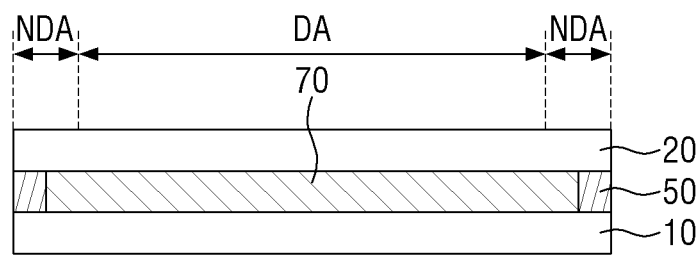
FIG. 2 is a cross-sectional view taken along line II-II' of FIG. 1.

FIG. 2 is a cross-sectional view taken along line II-II' of FIG. 1.

Referring to FIG. 2, the display device 1 may include a first display substrate 10 and a second display substrate 20 which faces the first display substrate 10. The display device 1 may further include a sealing member 50 which couples the first and second display substrates 10 and 20, and a filler layer 70 which is filled between the first and second display substrates 10 and 20.

The first display substrate 10 may include elements (e.g., display element provided in plural) and circuits which are connected to the elements for displaying an image. The first display substrate 10 may include, for example, pixel circuits (e.g., switching elements), a pixel-defining film PDL (e.g., pixel-defining layer) which defines an emission area provided in plural including a plurality of emission areas EMA (e.g., light emission area provided in plural) and a non-emission area NEM provided in plural including a plurality of non-emission areas NEM that will be described later, and self-light-emitting elements. In an embodiment, the self-light-emitting elements may be organic light-emitting diodes (OLEDs), quantum-dot light-emitting diodes, inorganic material-based micro-light-emitting diodes (microLEDs), and/or inorganic material-based nano-light-emitting diodes (nanoLEDs). The self-light-emitting elements will hereinafter be described as being, for example, OLEDs.

The second display substrate 20 may be disposed above the first display substrate 10 and may face the first display substrate 10. The second display substrate 20 may include a color control structure for converting the color of incident light (e.g., color-converting light). The color control structure may change the color of incident light by control of the wavelength of the incident light (e.g., wavelength-converting light).

The sealing member 50 may be disposed between the first and second display substrates 10 and 20, in the non-display area NDA. The sealing member 50 may be disposed along the edges of each of the first and second display substrates 10 and 20 and may surround the display area DA in a plan view. The first and second display substrates 10 and 20 may be coupled together via the sealing member 50. The sealing member 50 may include an organic material. The sealing member 50 may be formed of (or include) an epoxy resin, but the invention is not limited thereto.

The filler layer 70 may be disposed in the space between the first and second display substrates 10 and 20, surrounded by the sealing member 50. The filler layer 70 may fill the gap between the first and second display substrates 10 and 20. That is, the filler layer 70 may fill the gap between the first and second display substrates 10 and 20 and may couple the first and second display substrates 10 and 20 together. The filler layer 70 may be formed of a material capable of transmitting light therethrough. The filler layer 70 may include an organic material. In an embodiment, the filler layer 70 may be formed of a silicon (Si)-based organic material or an epoxy-based organic material, but the invention is not limited thereto. Alternatively, the filler layer 70 may not be provided.

Figure 3:
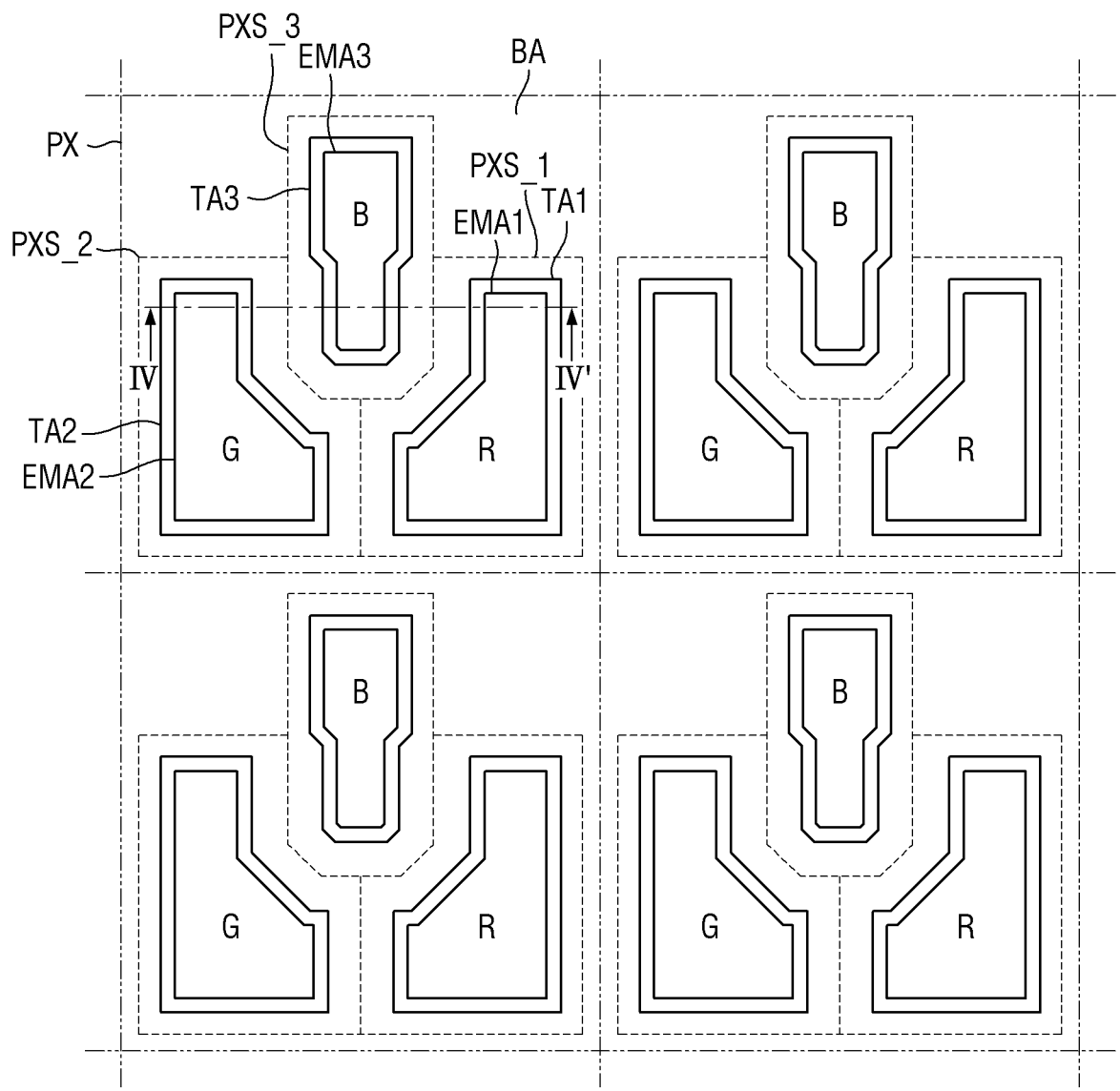
FIG. 3 is a plan view illustrating an arrangement of pixels of the display device of FIG. 1.
Figure 3:
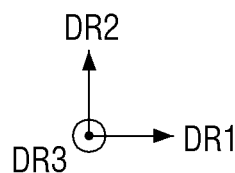

FIG. 3 is a plan view illustrating an embodiment of pixels PX of the display device 1 of FIG. 1.

Referring to FIG. 3, a first direction DR1 may also be referred to as a horizontal direction, a second direction DR2 may intersect the first direction DR1 may also be referred to as a vertical direction, and a third direction DR3 may intersect both the first and second directions DR1 and DR2 and may also be referred to as a thickness direction of the display device 1 (see FIG. 1). The plan view is a view along the third direction DR3 of the plane defined by the first direction DR1 and the second direction DR2 crossing each other.

The display area DA may include a plurality of pixels PX. The pixels PX may be minimal display units that repeat one after another to display an image. To display full colors, each of the pixels PX may include a subpixel PXS provided in plural including a plurality of subpixels PXS that emit light of different colors. In an embodiment, each of the pixels PX may include first, second, and third subpixels PXS_1, PXS_2, and PXS_3, which emit red light, green light, and blue light, respectively. One of the first subpixel PXS_1, one of the second subpixel PXS_2, and one of the third subpixel PXS_3 may be provided in each of the pixels PX.

Each of the subpixels PXS may include a light-transmission area TA provided in plural including light-transmission areas TA and a light-blocking area BA adjacent to or around the light-transmission area TA (e.g., light-blocking areas BA). The light-transmission area TA may emit light from an emission area EMA to the outside of the display device 1. In other words, light from the emission area EMA can be emitted to the outside of the display device 1 through the light-transmission area TA. The light-blocking area BA does not transmit light from the emission area EMA to the outside of the display device 1. In other words, the light-blocking area BA can reduce or effectively prevent light from the emission area EMA from being emitted to outside the display device 1.

Light-blocking areas BA of a pair of adjacent subpixels PXS (regardless of whether the pair of adjacent subpixels PXS are from the same pixel PX) may adjoin each other and may be connected together. The light-blocking areas BA of the pair of adjacent subpixels PXS may form an interface or meet each other to be connected to each other. Light-blocking areas BA of subpixels PXS may all be connected to one another, but the invention is not limited thereto. Light-transmission areas TA of the subpixels PXS may be separated from one another by the light-blocking areas BA. The light-transmission areas TA and the light-blocking areas BA will be described later in detail.

The subpixels PXS may all adjoin one another. The boundaries between the subpixels PXS may not be physically identifiable over the light-blocking areas BA that are integrally connected to one another.

The light-transmission areas TA of the subpixels PXS of each of the pixels PX may not have the same shape in the plan view (e.g., a planar shape). In an embodiment, the light-transmission area TA of a first subpixel PXS_1, e.g., a first light-transmission area TA1, may have substantially the same shape as the light-transmission area TA of a second subpixel PXS_2, e.g., a second light-transmission area TA2, but may have a different shape from the light-transmission area TA of a third subpixel PXS_3, e.g., a third light-transmission area TA3. The shape of the first light-transmission area TA1 may be symmetrical with the shape of the second light-transmission area TA2 with respect a boundary therebetween.

The first and second light-transmission areas TA1 and TA2 may be disposed adjacent to each other in the first direction DR1. The third light-transmission area TA3 may be disposed on same sides, in the second direction DR2, of the first and second light-transmission areas TA1 and TA2 and may be located in part between the first and second light-transmission areas TA1 and TA2. The third light-transmission area TA3 may be disposed on the upper left side of the first light-transmission area TA1 and on the right upper side of the second light-transmission area TA2.

The first light-transmission area TA1 may be disposed adjacent to the second light-transmission area TA2 to adjoin part of the second light-transmission area TA2 in the first direction DR1. The first light-transmission area TA1 may be disposed adjacent to the third light-transmission area TA3 to adjoin part of the third light-transmission area TA3. That is, the third light-transmission area TA3 may be disposed in at least part of the gap between the first and second light-transmission areas TA1 and TA2. Part of the third light-transmission area TA3 may be disposed between the first and second light-transmission areas TA1 and TA2, and the rest of (e.g., a remainder of) the third light-transmission area TA3 may be projected further from an upper edge of the first and second light-transmission areas TA1 and TA2 in the second direction DR2.

Each of the subpixels PXS may include a light-transmission area TA and a light-blocking area BA around the light-transmission area TA and may further include an emission area EMA which emits light, and a non-emission area NEM, which is disposed around the emission area EMA and does not emit light. Each of the pixels PX may include first, second, and third emission areas EMA1, EMA2, and EMA3.

Emission areas EMA may be disposed in (or corresponding to) respective light-transmission areas TA. That is, the first, second, and third emission areas EMA1, EMA2, and EMA3 may be disposed in first, second, and third light-transmission areas TA1, TA2, and TA3, respectively. The emission areas EMA may overlap with respective light-transmission areas TA, but the invention is not limited thereto. The planar shapes of the emission areas EMA may conform to (or correspond to) the planar shapes of the light-transmission areas TA, but the invention is not limited thereto.

The pixels PX may be alternately arranged along rows and columns. The shapes and the pattern of arrangement of the subpixels PXS in each of the pixels PX may be uniform, but the invention is not limited thereto. The pixels PX may generally have a square shape in the plan view, but the invention is not limited thereto. Alternatively, the pixels PX may have a rhombus or rectangular shape.

The cross-sectional structure of the display device 1 will hereinafter be described.

Figure 4:
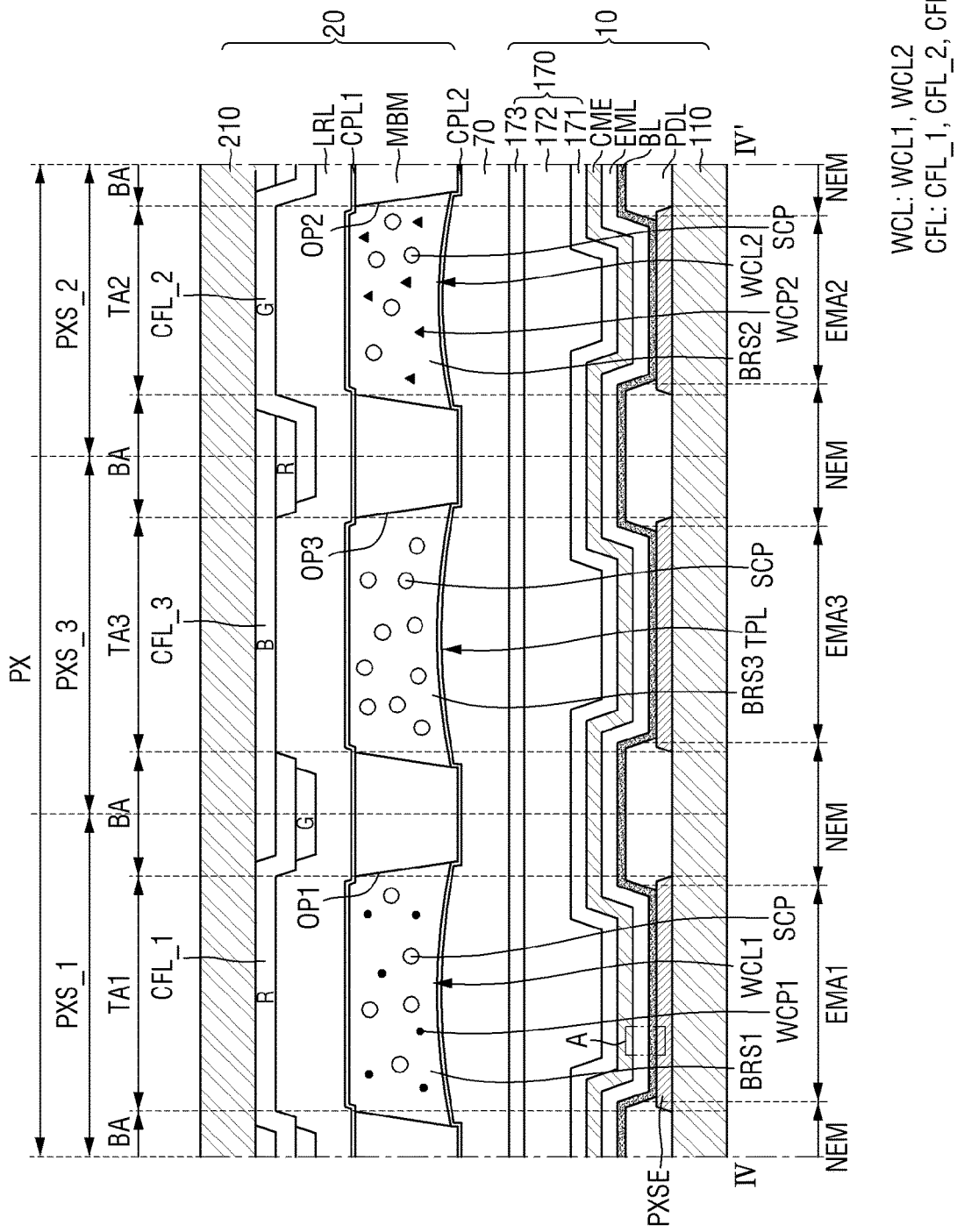
FIG. 4 is a cross-sectional view of the display device of FIG. 1.

FIG. 4 is a cross-sectional view of the display device 1 of FIG. 1.

Referring to FIG. 4, the first display substrate 10 includes a first substrate 110 and a light-emitting element provided in plural including a plurality of light-emitting elements which are disposed on the first substrate 110.

The cross-sectional structure of the first display substrate 10 will hereinafter be described in order from the first substrate 110 to a second substrate 210.

The first substrate 110 may be an insulating substrate. The first substrate 110 may include a transparent material. The first substrate 110 may include a transparent insulating material such as glass or quartz. The first substrate 110 may be a rigid substrate. Alternatively, the first substrate 110 may include plastic such as polyimide and may have flexibility such as rollability, bendability, or foldability.

A pixel electrode PXSE provided in plural including a plurality of pixel electrodes PXSE may be disposed on a surface of the first substrate 110. The pixel electrodes PXSE may be respectively disposed in subpixels PXS of a pixel PX. The pixel electrodes PXSE of the subpixels PXS may be isolated from one another.

Although not specifically illustrated, a circuit layer for driving the pixel electrodes PXSE may be disposed between the first substrate 110 and the pixel electrodes PXSE. The circuit layer may include a plurality of thin-film transistors and capacitors and will be described later in detail.

The pixel electrodes PXSE may correspond to the first electrodes of light-emitting elements (or light-emitting diodes (LEDs)), for example, anodes. The pixel electrodes PXSE may have a structure in which a high-work function material layer of indium tin oxide ("ITO"), indium zinc oxide ("IZO"), zinc oxide (ZnO), or indium oxide ($In_2O_3$) and a reflective material layer of silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca), or a combination thereof are stacked. The high-work function material layer may be disposed above the reflective material layer, close to an emission layer EML of the light-emitting elements. The pixel electrodes PXSE may have a multilayer structure of ITO/Mg, ITO/MgF, ITO/Ag, or ITO/Ag/ITO, but the invention is not limited thereto.

The pixel-defining film PDL may be disposed on the surface of the first substrate 110, along the boundaries of each of the pixel electrodes PXSE. Non-emission areas NEM and emission areas EMA may be defined by solid portions of the pixel-defining film PDL and pixel openings which are defined by the solid portions of the pixel-defining film PDL. The pixel-defining film PDL may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or benzocyclobutene ("BCB"). The pixel-defining film PDL may include an inorganic material.

A barrier layer BL is disposed on the pixel-defining film PDL. The barrier layer BL may be disposed not only on the pixel-defining film PDL, but also on the pixel electrodes PXSE. The barrier layer BL may cover the pixel electrodes PXSE and may be disposed even on the pixel-defining film PDL. The barrier layer BL may be connected integrally throughout the subpixels PXS. That is, the barrier layer BL may be disposed on an entirety of the first substrate 110, but the invention is not limited thereto. As the barrier layer BL is provided, any defects such as dark spots or pixel shrinkage can be reduced or effectively prevented. The barrier layer BL will be described later in detail.

The emission layer EML is disposed on the barrier layer BL. The emission layer EML may be disposed on the entirety of the first substrate 110. In an embodiment where the display device 1 is an organic light-emitting display device, the emission layer EML may include an organic layer that includes an organic material. The organic layer may include a plurality of organic emission layers EML1, EML2, EML3, and EML4 (see FIG. 5) and may further include, as an auxiliary layer for assisting with the emission of light, a hole injection/transport layer and/or an electron injection/transport layer. In an embodiment where the display device 1 is a microLED display device or a nanoLED display device, the emission layer EML may include an inorganic material such as an inorganic semiconductor.

The emission layer EML may have a tandem structure in which the organic emission layers EML1, EML2, EML3, and EML4 are disposed to overlap with one another in the thickness direction (e.g., face one another) with charge-generation layers respectively interposed therebetween. The organic emission layers EML1, EML2, EML3, and EML4 may emit light of the same wavelength or light of different wavelengths. At least some of the layers of the emission layer EML may be separated between the subpixels PXS.

The structure of the emission layer EML will hereinafter be described with reference to FIG. 5.

Figure 5:
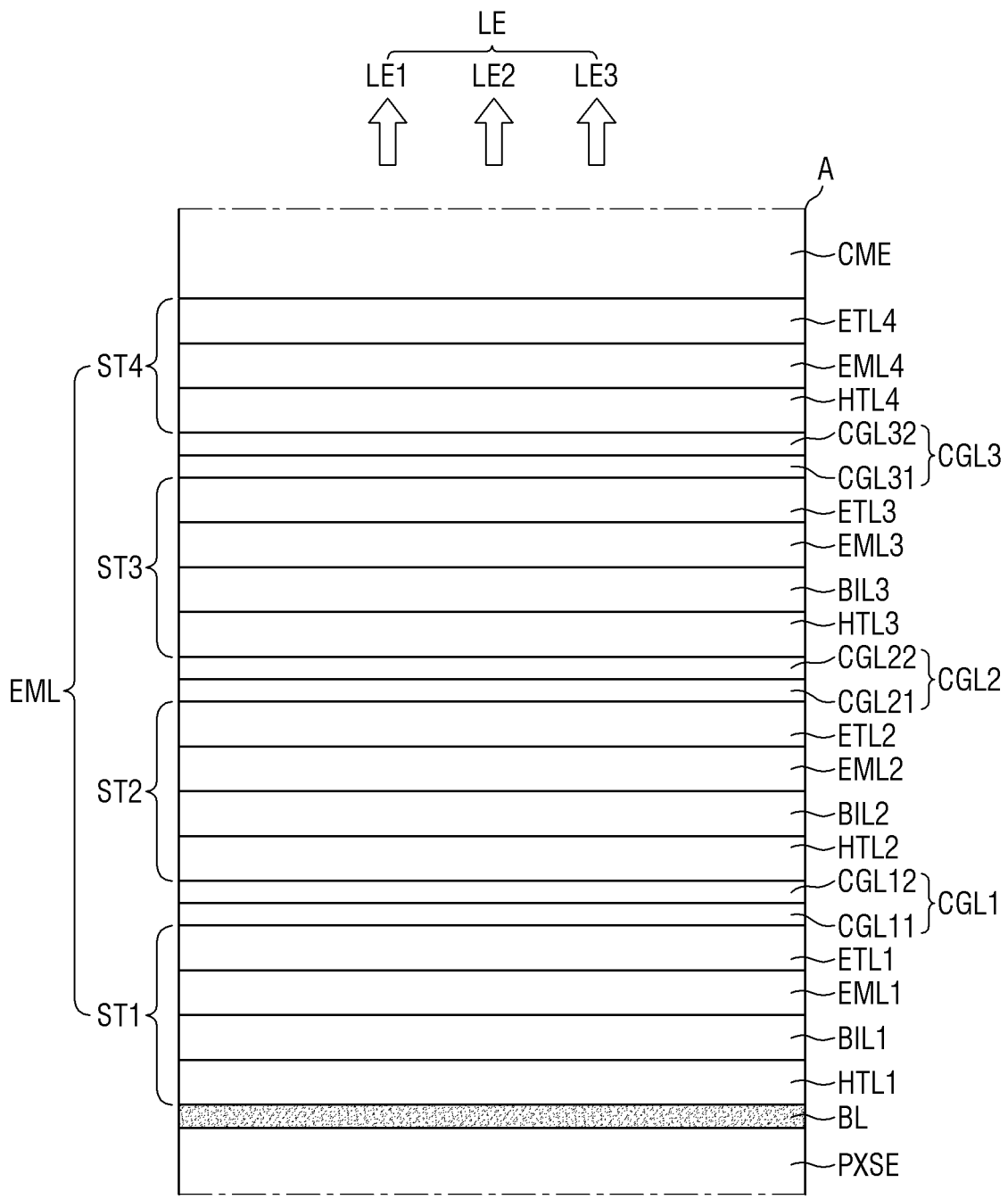
FIG. 5 is an enlarged cross-sectional view of area A of FIG. 4.

FIG. 5 is an enlarged cross-sectional view of area A of FIG. 4.

Referring to FIG. 5, emitted light LE which is finally emitted by the emission layer EML, may be a mixed light having first, second, and third components LE1, LE2, and LE3 combined therein. The first and second components LE1 and LE2 may have a peak wavelength of about 440 nanometers (nm) to about 480 nm, and the third component LE3 may have a peak wavelength of about 500 nm to about 550 nm. That is, the emitted light LE may be a mixed light of blue light and green light.

The emission layer EML may have a structure in which the organic emission layers EML1, EML2, EML3, and EML4 are disposed to overlap with one another, e.g., the tandem structure. In an embodiment, the emission layer EML may include a first stack ST1, which includes a first emission layer EML1, a second stack ST2, which is disposed on the first stack ST1 and includes a second emission layer EML2, a third stack ST3, which is disposed on the second stack ST2 and includes a third emission layer EML3, a fourth stack ST4, which is disposed on the third stack ST3 and includes a fourth emission layer EML4, a first charge-generation layer CGL1, which is disposed between the first and second stacks ST1 and ST2, a second charge-generation layer CGL2, which is disposed between the second and third stacks ST2 and ST3, and a third charge-generation layer CGL3, which is disposed between the third and fourth stacks ST3 and ST4. The first, second, third, and fourth stacks ST1, ST2, ST3, and ST4 may be disposed to overlap with one another. The first, second, third, and fourth emission layers EML1, EML2, EML3, and EML4 may be disposed to overlap with one another.

At least one of the first, second, third, and fourth emission layers EML1, EML2, EML3, and EML4 may emit green light, and the other emission layers may emit blue light. Here, the blue light may have the same peak wavelength range or different peak wavelength ranges. In an embodiment, the emitted light LE may be mixed light having the first, second, and third components LE1, LE2, and LE3 combined therein, and the first, second, and third components LE1, LE2, and LE3 may be first blue light having a first peak wavelength range, second blue light having a second peak wavelength range, and green light, respectively. One of the first blue light and the second blue light may be deep-blue light, and the other blue light may be sky-blue light.

The emitted light LE from the emission layer EML is a combination of blue light and green light and includes long- and short-wavelength components. Thus, the emission layer EML may emit blue light having a broad peak wavelength range as the emitted light LE and may thus be able to improve color visibility at side viewing angles of the display device 1. As the third component LE3 of the emitted light LE is green light, the green-light component of light to be emitted out of the display device 1 can be compensated for, and as a result, the color reproducibility of the display device 1 can be improved.

Each of the first, second, third, and fourth emission layers EML1, EML2, EML3, and EML4 may include a host and a dopant. The material of the host is not particularly limited. In an embodiment, tris(8-hydroxyquinolino)aluminum ($Alq_3$), 4,4'-bis(N-carbazolyl)-1,1'-biphenyl ("CBP"), poly (n-vinylcarbazole) ("PVK"), 9,10-di(naphthalene-2-yl)anthracene ("ADN"), 4,4',4"-Tris(carbazol-9-yl)-triphenylamine ("TCTA"), 1,3,5-tris(N-phenylbenzimidazole-2-yl) benzene ("TPBi"), 3-tert-butyl-9,10-di(naphth-2-yl) anthracene ("TBADN"), distyrylarylene ("DSA"), 4,4'-bis (9-carbazolyl)-2,2'-dimethyl-biphenyl ("CDBP"), or 2-methyl-9,10-bis(naphthalen-2-yl)anthracene ("MADN") may be used as the host.

In an embodiment, the emission layers that emit blue light may include a fluorescent material selected from among spiro-DPVBi, spiro-6P, distyryl-benzene ("DSB"), DSA (distyryl-arylene), a polyfluorene ("PFO")-based polymer, and poly(p-phenylene vinylene) ("PPV"). In an embodiment, the emission layers that emit blue light may include a phosphorescent material including an organometallic complex such as $(4,6-F2ppy)_2Irpic$.

In an embodiment, the emission layer that emits green light may include, a fluorescent material containing $Alq_3$ or as a phosphorescent material, fac-tris(2-phenylpyridine) iridium ($Ir(ppy)_3$), bis(2-phenylpyridine)(acetylacetonate) iridium(III) ($Ir(ppy)_2(acac)$), or 2-phenyl-4-methyl-pyridine iridium ($Ir(mpyp)_3$).

The first stack ST1 may be disposed on the pixel electrodes PXSE and closest to the pixel electrode PXSE among the various stacks. In a case where the barrier layer BL is disposed on the pixel electrodes PXSE, the first stack ST1 may be disposed on the barrier layer BL and may further include a first hole transport layer HTL1, a first electron-blocking layer BIL1 and a first electron transport layer ETL1.

The first hole transport layer HTL1 may be disposed on the barrier layer BL. The first hole transport layer HTL1 may facilitate the transport of holes and may include a hole transport material.

The first electron-blocking layer BIL1 may be disposed on the first hole transport layer HTL1, between the first hole transport layer HTL1 and the first emission layer EML1. The first electron-blocking layer BIL1 may be formed of a hole transport material and a metal (or a metal oxide) to reduce or effectively prevent electrons from spilling over to the first hole transport layer HTL1.

The first electron transport layer ETL1 may be disposed on the first emission layer EML1, between a first charge generation layer CGL1 and the first emission layer EML1. The first electron transport layer ETL1 may include an electron transport material.

The first charge generation layer CGL1 may be disposed on the first stack ST1. The first charge generation layer CGL1 may be located between the first and second stacks ST1 and ST2. The first charge generation layer CGL1 may inject electric charge into each emission layer. The first charge generation layer CGL1 may balance electric charge between the first and second stacks ST1 and ST2. The first charge generation layer CGL1 may include an n-type charge generation layer CGL11 and a p-type charge generation layer CGL12 facing each other. The p-type charge generation layer CGL12 may be disposed on the n-type charge generation layer CGL11 and may be located between the n-type charge generation layer CGL11 and the second stack ST2.

The n-type charge generation layer CGL11 provides electrons to the first emission layer EML1, which is closer to the pixel electrodes PXSE than the second emission layer EML2, and provides holes to the second emission layer EML2, which is included in the second stack ST2. As the first charge generation layer CGL1 is disposed between the first and second stacks ST1 and ST2 and provides electric charge to each emission layer, emission efficiency can be raised, and a driving voltage can be lowered.

The second stack ST2 may be disposed on the first charge generation layer CGL1 and may further include a second hole transport layer HTL2, a second electron-blocking layer BIL2, and a second electron transport layer ETL2. A second charge generation layer CGL2 may be disposed on the second stack ST2. The second charge generation layer CGL2 may include an n-type charge generation layer CGL21 and a p-type charge generation layer CGL22 facing each other. The third stack ST3 may be disposed on the second charge generation layer CGL2 and may further include a third hole transport layer HTL3, a third electron-blocking layer BIL3, and a third electron transport layer ETL3. A third charge generation layer CGL3 may be disposed on the third stack ST3. The third charge generation layer CGL3 may include an n-type charge generation layer CGL31 and a p-type charge generation layer CGL32 facing each other. The fourth stack ST4 may be disposed on the third charge generation layer CGL3 and may further include a fourth hole transport layer HTL4 and a fourth electron transport layer ETL4.

The patterns of arrangement of the second hole transport layer HTL2, the second electron-blocking layer BIL2, and the second electron transport layer ETL2 in the second stack ST2, the third hole transport layer HTL3, the third electron-blocking layer BIL3, and the third electron transport layer ETL3 in the third stack ST3, and the fourth hole transport layer HTL4 and the fourth electron transport layer ETL4 in the fourth stack ST4 may all be substantially the same as the pattern of arrangement of the first hole transport layer HTL1, the first electron-blocking layer BIL1 and the first electron transport layer ETL1 in the first stack ST1, but the invention is not limited thereto. Also, the functions and the materials of the second, third, and fourth hole transport layers HTL2, HTL3, and HTL4, the second and third electron-blocking layers BIL2 and BIL3, and the second, third, and fourth electron transport layers ETL2, ETL3, and ETL4 may be substantially the same as the functions and the materials of the first hole transport layer HTL1, the first electron-blocking layer BIL1 and the first electron transport layer ETL1, respectively, but the invention is not limited thereto.

Also, the functions and the materials of the second and third charge generation layers CGL2 and CGL3 may be substantially the same as the functions and the material of the first charge generation layer CGL1, but the invention is not limited thereto.

Although not specifically illustrated, a hole injection layer may be further disposed between the first stack ST1 and the barrier layer BL, between the second stack ST2 and the first charge generation layer CGL1, between the third stack ST3 and the second charge generation layer CGL2, and/or between the fourth stack ST4 and the third charge generation layer CGL3. The hole injection layer may facilitate the injection of holes into the first, second, third, and fourth emission layers EML1, EML2, EML3, and EML4.

Although not specifically illustrated, an electron injection layer may be further disposed between the fourth electron transport layer ETL4 and a common electrode CME, between the third charge generation layer CGL3 and the third stack ST3, between the second charge generation layer CGL2 and the second stack ST2, and/or between the first charge generation layer CGL1 and the first stack ST1.

The emission layer EML has been described above as including the first, second, third, and fourth emission layers EML1, EML2, EML3, and EML4, but the invention is not limited thereto. Alternatively, the emission layer EML may include only the first, second, and third emission layers EML1, EML2, and EML3, and the first, second, and third emission layers EML1, EML2, and EML3 may all emit blue light.

The wavelength of light emitted by the emission layer EML may be the same through the subpixels PXS. In an embodiment, the emission layer EML may emit mixed light of blue light and green light or ultraviolet ("UV") light, and the color control structure may include a wavelength conversion layer WCL. In an embodiment, the subpixels PXS may emit light of different colors.

The wavelength of light emitted by the emission layer EML may differ from one subpixel PXS to another subpixel PXS. In an embodiment, the emission layer EML may emit light of a first color in a first subpixel PXS_1, light of a second color in a second subpixel PXS_2, and light of a third color in a third subpixel PXS_3.

Referring again to FIG. 4, the common electrode CME may be disposed on the emission layer EML. The common electrode CME may be in contact with the emission layer EML. As being in contact, elements may form an interface therebetween. The common electrode CME may be connected to each of the subpixels PXS. The common electrode CME may be a full electrode disposed on the entirety of the first substrate 110 without regard to the distinction between the subpixels PXS. The common electrode CME may correspond to the second electrodes of LEDs, e.g., cathodes.

The common electrode CME may include a low-work function material layer, which is formed of a low-work function material such as Li, Ca, LiF/Ca, LiF/Al, Al, Mg, Ag, Pt, Pd, Ni, Au Nd, Ir, Cr, BaF, Ba, or a compound or combination thereof (e.g., the combination of Ag and Mg). The common electrode CME may further include a transparent metal oxide layer, which is disposed on the low-work function material layer.

The pixel electrodes PXSE, the emission layer EML, and the common electrode CME may form light-emitting elements (e.g., OLEDs). Light emitted by the emission layer EML of a light-emitting element may be emitted upwardly through the common electrode CME.

A thin-film encapsulation structure 170 may be disposed on the common electrode CME. The thin-film encapsulation structure 170 may include at least one thin-film encapsulation layer. In an embodiment, the thin-film encapsulation structure 170 may include a first inorganic film 171, an organic film 172, and a second inorganic film 173. The first and second inorganic films 171 and 173 may include silicon nitride, silicon oxide, or silicon oxynitride. The organic film 172 may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or BCB.

The second display substrate 20 may be disposed on the thin-film encapsulation structure 170 to face the thin-film encapsulation structure 170. The second substrate 210 of the second display substrate 20 may include a transparent material. The second substrate 210 may include a transparent insulating material such as glass or quartz. The second substrate 210 may be a rigid substrate. Alternatively, the second substrate 210 may include plastic such as polyimide or may have flexibility such as rollability, bendability, or foldability.

The second substrate 210 may have the same structure as the first substrate 110 or may have a different material, thickness, or transmittance from the first substrate 110. In an embodiment, the second substrate 210 may have a higher light transmittance than the first substrate 110. The second substrate 210 may be thicker or thinner than the first substrate 110.

A color filter layer CFL may be disposed on a surface of the second substrate 210. The color filter layer CFL may include a pigment or a dye capable of absorbing all wavelengths except for a particular wavelength. The color filter layer CFL may block the emission of light of colors other than a designated color for each of the subpixels PXS. That is, the color filter layer CFL may selectively transmit light of a particular color therethrough.

The color filter layer CFL may include first, second, and third color filter layers CFL_1, CFL_2, and CFL_3 (e.g., color filters or color filter patterns). The first, second, and third color filter layers CFL_1, CFL_2, and CFL_3 may be red, green, and blue filter layers, respectively. That is, the first, second, and third color filter layers CFL_1, CFL_2, and CFL_3 may selectively transmit red light, green light, and blue light, respectively, therethrough.

The first, second, and third color filter layers CFL_1, CFL_2, and CFL_3 may be disposed in the first, second, and third subpixels PXS_1, PXS_2, and PXS_3, respectively. In an embodiment, the first, second, and third color filter layers CFL_1, CFL_2, and CFL_3 may be disposed in first, second, and third light-transmission areas TA1, TA2, and TA3, respectively. The third color filter layer CFL_3 and at least one of the first and second color filter layers CFL_1 and CFL_2 may also be disposed in light-blocking areas BA of the pixel PX. The first, second, and third color filter layers CFL_1, CFL_2, and CFL_3 may be disposed in the light-blocking areas BA.

Thus, not only the emission of light, but also the reflection of external light can be suppressed in the light-blocking areas BA. The first, second, and third color filter layers CFL_1, CFL_2, and CFL_3 may block the emission of light of other colors than each designated color, and as a result, red light, green light, and blue light may all be blocked in the light-blocking areas BA. However, the invention is not limited thereto. A light-absorbing member including a light-absorbing material capable of absorbing visible light may be disposed in the light-blocking areas BA.

A low refractive film LRL may be disposed on the color filter layer CFL. The low refractive film LRL may be disposed in and across the light-transmission areas TA and the light-blocking areas BA. The low refractive film LRL may have a lower refractive index than a color control layer (WCL and TPL). In an embodiment, the low refractive film LRL may have a refractive index of about 1.1 to about 1.4.

The low refractive film LRL may reflect some of light emitted from the color control layer (WCL and TPL) toward the second substrate 210, back to the color control layer (WCL and TPL). That is, the low refractive film LRL may recycle some of the light emitted toward the second substrate 210 through the color control layer (WCL and TPL), thereby improving the efficiency of using light and the optical efficiency of the display device 1. The low refractive film LRL may include an organic material and may include particles dispersed therein.

A first capping layer CPL1 may be disposed on the low refractive film LRL. The first capping layer CPL1 may reduce or effectively prevent the color filter layer CFL and the low refractive film LRL from being damaged or contaminated by impurities from the outside such as moisture or the air. Also, the first capping layer CPL1 may prevent the colorants of the color filter layer CFL from diffusing into other elements.

The first capping layer CPL1 may be in direct contact with a surface of the low refractive film LRL (e.g., a surface of the low refractive film LRL that faces the first display substrate 10). The first capping layer CPL1 may be formed of an inorganic material. In an embodiment, the first capping layer CPL1 may include silicon nitride, aluminum nitride, zirconium nitride, titanium nitride, hafnium nitride, tantalum nitride, silicon oxide, aluminum oxide, titanium oxide, tin oxide, or silicon oxynitride.

A bank layer MBM is disposed on the first capping layer CPL1. The bank layer MBM may include an organic material. The bank layer MBM may include a light-absorbing material capable of absorbing visible light. In an embodiment, the bank layer MBM may include an organic light-blocking material. The bank layer MBM may be a type of light-blocking member. The bank layer MBM may be disposed along the boundaries of each of the subpixels PXS, and the subpixels PXS may be separated from one another by solid portions of the bank layer MBM.

The bank layer MBM may define the light-blocking areas BA and the light-transmission areas TA. Areas where the bank layer MBM is disposed may become the light-blocking areas BA. Parts of the color control layer (WCL and TPL) not covered, but exposed to outside the bank layer MBM may become the light-transmission areas TA. The bank layer MBM is formed of a material capable of blocking the transmission of light and reduces or effectively prevents light from infiltrating between neighboring subpixels PXS and causing color mixing.

The bank layer MBM may define first, second, and third openings OP1, OP2, and OP3. The first, second, and third openings OP1, OP2, and OP3 may be disposed in the light-transmission areas TA and may overlap with the light-transmission areas TA in the thickness direction. The color control layer (WCL and TPL) may be disposed in the first, second, and third openings OP1, OP2, and OP3, which are defined by solid portions of the bank layer MBM.

The color control layer (WCL and TPL) may include a wavelength conversion layer WCL, which converts the wavelength of incident light, and a light-transmitting layer TPL, which transmits the incident light therethrough without changing the wavelength of the incident light. The wavelength conversion layer WCL and the light-transmitting layer TPL (e.g., light-transmitting pattern) may be disposed in different subpixels PXS to be separated from one another. The wavelength conversion layer WCL and the light-transmitting layer TPL may overlap with the emission areas EMA and the light-transmission areas TA in (or along) the thickness direction. The wavelength conversion layer WCL and the light-transmitting layer TPL may be spaced apart from one another in a direction along the first substrate 110. The gaps between the wavelength conversion layer WCL and the light-transmitting layer TPL may generally overlap (or correspond to) with the light-blocking areas BA.

Light emitted by the emission layer EML may be incident upon the wavelength conversion layer WCL and the light-transmitting layer TPL. The wavelength of light incident upon the wavelength conversion layer WCL may be changed (e.g., wavelength-converted or color converted), and the wavelength of light incident upon the light-transmitting layer TPL may be maintained. As a result, light incident upon the wavelength conversion layer WCL and the light-transmitting layer TPL may exhibit the colors of the first, second, and third subpixels PXS_1, PXS_2, and PXS_3. The wavelength conversion layer WCL may be disposed in subpixels PXS in which light is wavelength-converted because of having different colors from incident light from the emission layer EML. The light-transmitting layer TPL may be disposed in subpixels PXS in which light is emitting having the same color as the incident light from the emission layer EML. However, the invention is not limited to this. Alternatively, the light-transmitting layer TPL may be omitted.

In an embodiment, the wavelength conversion layer WCL may include first and second wavelength conversion patterns WCL1 and WCL2, which are disposed in the first and second subpixels PXS_1 and PXS_2, respectively.

The first wavelength conversion pattern WCL1 may include a first base resin BRS1 and a first wavelength conversion material WCP1, which is disposed in the first base resin BRS1. The second wavelength conversion pattern WCL2 may include a second base resin BRS2 and a second wavelength conversion material WCP2, which is disposed in the second base resin BRS2. The light-transmitting layer TPL may include a third base resin BRS3 and a scatterer SCP, which is disposed in the third base resin BRS3.

The first, second, and third base resins BRS1, BRS2, and BRS3 may include a light-transmitting organic material. In an embodiment, the first, second, and third base resins BRS1, BRS2, and BRS3 may include an epoxy resin, an acrylic resin, a cardo resin, or an imide resin. The first, second, and third base resins BRS1, BRS2, and BRS3 may all be formed of the same material, but the invention is not limited thereto.

The scatterer SCP may be particles of a metal oxide or particles of an organic material. The metal oxide may be, for example, titanium oxide ($TiO_2$), zirconium oxide ($ZrO_2$), aluminum oxide (Al2O3), indium oxide ($In_2O_3$), zinc oxide (ZnO), or tin oxide ($SnO_2$), and the organic material may be, for example, an acrylic resin or a urethane resin.

The first wavelength conversion material WCP1 may be a material that converts blue light into red light, and the second wavelength conversion material WCP2 may be a material that converts blue light into green light. The first and second wavelength conversion materials WCP1 and WCP2 may be quantum dots, quantum rods, or phosphors. The quantum dots may include group IV nanocrystals, group II-VI compound nanocrystals, group III-V compound nanocrystals, group IV-VI nanocrystals, or a combination thereof. Each of the first and second wavelength conversion patterns WCL1 and WCL2 may further include the scatterer SCP, which enhances the efficiency of wavelength conversion.

The light-transmitting layer TPL, which is disposed in the third subpixel PXS_3, may transmit incident blue light therethrough without changing the wavelength of the incident blue light. The scatterer SCP of the light-transmitting layer TPL may scatter light and may thereby control the emission angle of light to be emitted through the light-transmitting layer TPL. The light-transmitting layer TPL may not include a wavelength conversion material.

A second capping layer CPL2 is disposed on the wavelength conversion layer WCL and the light-transmitting layer TPL. The second capping layer CPL2 may be formed of an inorganic material. The second capping layer CPL2 may include one of the aforementioned materials for forming the first capping layer CPL1. The second capping layer CPL2 may be formed of the same material as the first capping layer CPL1, but the invention is not limited thereto.

The second capping layer CPL2 may cover the first and second wavelength conversion patterns WCL1 and WCL2, the light-transmitting layer TPL, and the bank layer MBM. The second capping layer CPL2 may cover surfaces of the first and second wavelength conversion patterns WCL1 and WCL2 and a surface of the light-transmitting layer TPL. The second capping layer CPL2 may cover not only an upper surface which is furthest from the first substrate 110, but also sides (e.g., side surfaces) of the bank layer MBM. The second capping layer CPL2 may be conformal to height differences formed by the color control layer (WCL and TPL) and the bank layer MBM.

Although not specifically illustrated, spacers (not illustrated) may be further disposed on the second capping layer CPL2 to maintain a cell gap between the first and second display substrates 10 and 20.

The cross-sectional structure of the first display substrate 10 will hereinafter be described.

Figure 6:
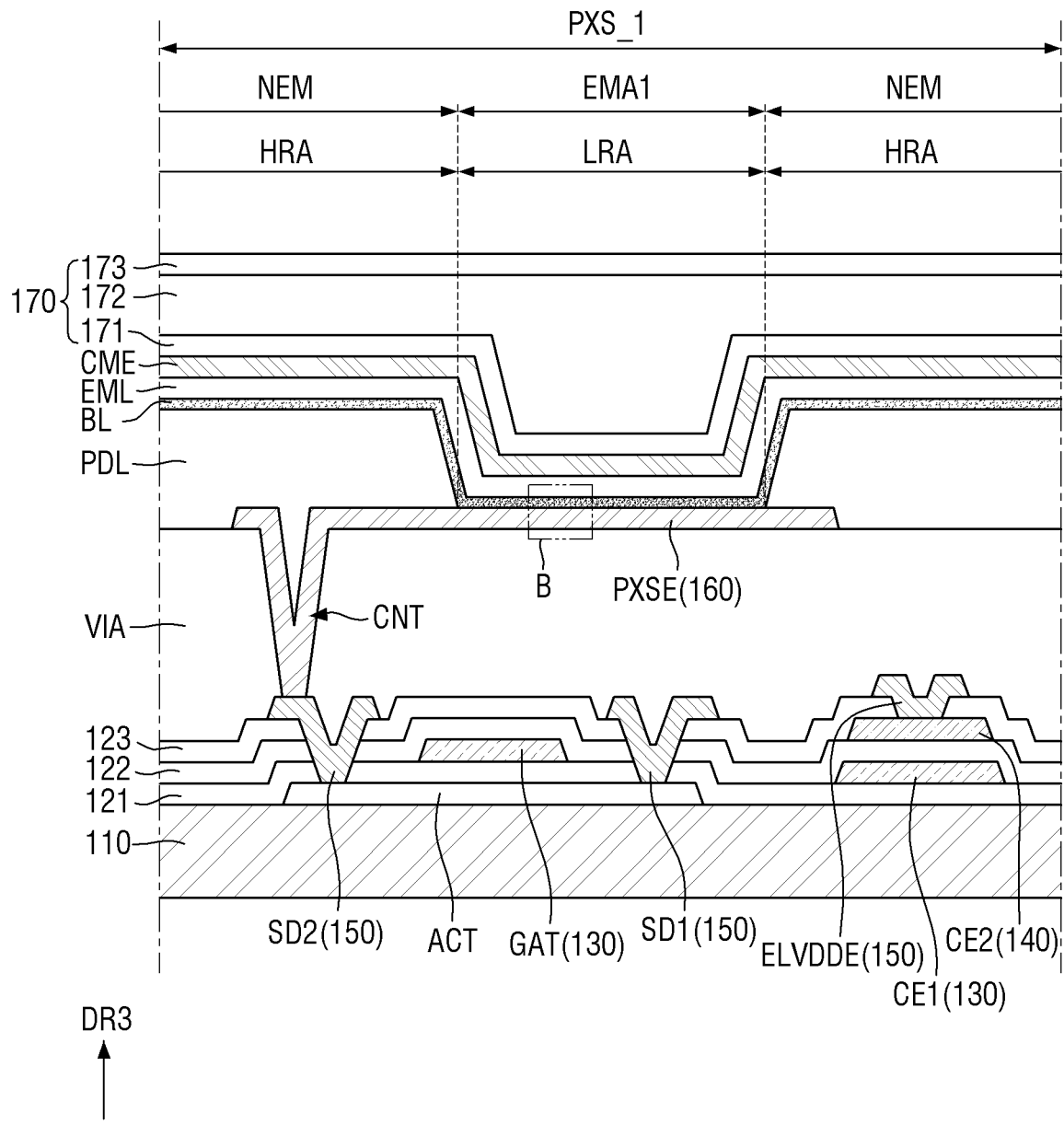
FIG. 6 is a cross-sectional view of an embodiment of a first display substrate of the display device of FIG. 1.
Figure 7:
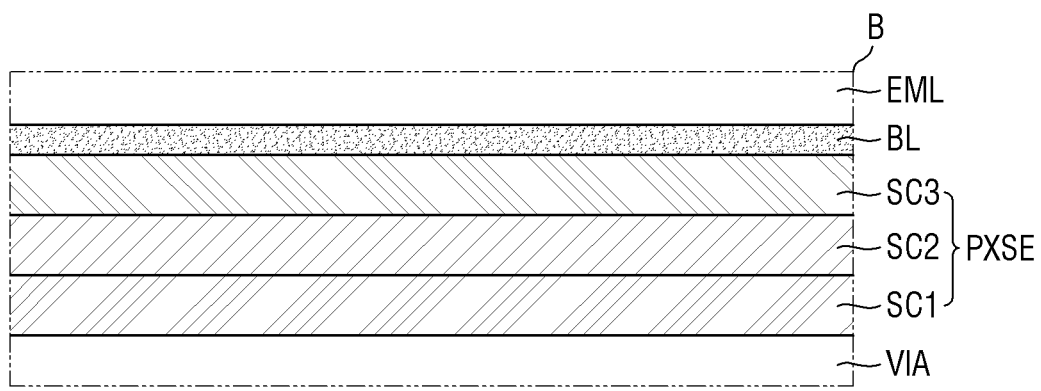
FIG. 7 is an enlarged cross-sectional view of area B of FIG. 6.

FIG. 6 is a cross-sectional view of an embodiment of the first display substrate 10 of the display device 1 of FIG. 1. FIG. 7 is an enlarged cross-sectional view of area B of FIG. 6. FIG. 6 is a cross-sectional view of a first subpixel PXS_1 and illustrates the circuit layer of the first subpixel PXS_1. FIG. 7 is an enlarged cross-sectional view illustrating an area adjacent to a pixel electrode PXSE of FIG. 6.

Referring to FIGS. 6 and 7, the first display substrate 10 may further include a semiconductor layer ACT, a first insulating layer 121, a first gate conductive layer 130, a second insulating layer 122, a second gate conductive layer 140, a third insulating layer 123, a first data conductive layer 150, a via layer VIA and a second data conductive layer 160, which are sequentially stacked on the first substrate 110. The semiconductor layer ACT, the first insulating layer 121, the first gate conductive layer 130, the second insulating layer 122, the second gate conductive layer 140, the third insulating layer 123, the first data conductive layer 150, and the via layer VIA may be formed as single layers or as stacks of multiple films. There may be further provided layers between the semiconductor layer ACT, the first insulating layer 121, the first gate conductive layer 130, the second insulating layer 122, the second gate conductive layer 140, the third insulating layer 123, the first data conductive layer 150, and the via layer VIA.

The semiconductor layer ACT is disposed on the first substrate 110. The semiconductor layer ACT may form the channel of the first subpixel PXS_1. The semiconductor layer ACT may include an oxide semiconductor. The oxide semiconductor may include, for example, a binary compound ($AB_x$), a tertiary compound ($AB_xC_y$), or a quaternary compound ($AB_xC_yD_z$) containing indium (In), zinc (Zn), gallium (Ga), titanium (Ti), Al, hafnium (Hf), zirconium (Zr), or Mg. In an embodiment, the semiconductor layer ACT may include indium zinc titanium oxide ("ITZO") or indium gallium zinc oxide ("IGZO"), but the invention is not limited thereto. In an embodiment, the semiconductor layer ACT may include at least one of polycrystalline silicon, monocrystalline silicon, low-temperature polycrystalline silicon, and amorphous silicon.

The first insulating layer 121 is disposed on the semiconductor layer ACT. The first insulating layer 121 may be a first gate insulating film having a gate insulating function. The first insulating layer 121 may include a silicon compound or a metal oxide. In an embodiment, the first insulating layer 121 may include silicon oxide, silicon nitride, silicon oxynitride, aluminum oxide, tantalum oxide, hafnium oxide, zirconium oxide, or titanium oxide.

The first gate conductive layer 130 is disposed on the first insulating layer 121. The first gate conductive layer 130 may include a gate electrode GAT of a thin-film transistor of the first subpixel PXS_1, a scan line connected to the gate electrode GAT, and a first capacitor electrode CE1 of a sustain capacitor.

The first gate conductive layer 130 may include at least one metal selected from among molybdenum (Mo), Al, Pt, Pd, Ag, Mg, Au, Ni, Nd, Ir, Cr, Ca, Ti, tantalum (Ta), tungsten (W), and copper (Cu).

The second insulating layer 122 may be disposed on the first gate conductive layer 130. The second insulating layer 122 may be an interlayer insulating film or a second gate insulating film. The second insulating layer 122 may include an inorganic insulating material such as silicon oxide, silicon nitride, silicon oxynitride, hafnium oxide, aluminum oxide, titanium oxide, tantalum oxide, or zinc oxide.

The second gate conductive layer 140 is disposed on the second insulating layer 122. The second gate conductive layer 140 may include a second capacitor electrode CE2 of the sustain capacitor. The second gate conductive layer 140 may include at least one metal selected from among Mo, Al, Pt, Pd, Ag, Mg, Au, Ni, Nd, Ir, Cr, Ca, Ti, Ta, W, and Cu. The second gate conductive layer 140 may be formed of the same material as the first gate conductive layer 130, but the invention is not limited thereto.

The third insulating layer 123 is disposed on the second gate conductive layer 140. The third insulating layer 123 may be an interlayer insulating film. The third insulating layer 123 may include an inorganic insulating material such as silicon oxide, silicon nitride, silicon oxynitride, hafnium oxide, aluminum oxide, titanium oxide, tantalum oxide, or zinc oxide.

The first data conductive layer 150 is disposed on the third insulating layer 123. The first data conductive layer 150 may include first and second terminal electrodes SD1 and SD2 of the thin-film transistor of the first subpixel PXS_1. The first and second terminal electrodes SD1 and SD2 may be respective patterns of the first data conductive layer 150 and electrically connected to source and drain regions of the semiconductor layer ACT through contact holes that penetrate the third insulating layer 123, the second insulating layer 122, and the first insulating layer 121. A first power supply voltage electrode ELVDDE of the first subpixel PXS_1 may be formed as a respective pattern of the first data conductive layer 150. The first power supply voltage electrode ELVDDE may be electrically connected to the second capacitor electrode CE2 through a contact hole that penetrates the third insulating layer 123.

The first data conductive layer 150 may include at least one metal selected from among Al, Mo, Pt, Pd, Ag, Mg, Au, Ni, Nd, Ir, Cr, Ca, Ti, Ta, W, and Cu. The first data conductive layer 150 may be formed as a single film or a multilayer film. In an embodiment, the first data conductive layer 150 may be formed as a stack of metals such as Ti/Al/Ti, Mo/Al/Mo, Mo/AlGe/Mo, or Ti/Cu.

The via layer VIA is disposed on the first data conductive layer 150. The via layer VIA covers the first data conductive layer 150. In a case where the via layer VIA is formed as an organic layer, the via layer VIA may generally have a flat top surface regardless of any height differences therebelow. The via layer VIA may include an organic insulating material such as an acrylic resin, an epoxy resin, a phenolic resin, a polyamide resin, a polyimide resin, an unsaturated polyester resin, a polyphenylene ether resin, a polyphenylene sulfide resin, or BCB.

A pixel electrode PXSE of a second data conductive layer 160 is disposed on the via layer VIA. The second data conductive layer 160 may include the pixel electrode PXSE as a pattern thereof. The pixel electrode PXSE may be connected to the second terminal electrode SD2 through a first contact hole CNT that penetrates the via layer VIA.

The pixel electrode PXSE may include multiple laminated structures. In an embodiment, the pixel electrode PXSE may include first, second, and third conductive layers SC1, SC2, and SC3, which are sequentially stacked and/or laminated). The first and third laminated conductive layers SC1 and SC3 (e.g., first conductive layer and third conductive layer) may include ITO, and the second laminated conductive layer SC2 (e.g., second conductive layer) may include Ag. That is, the pixel electrode PXSE of a light-emitting element includes a first conductive layer, a second conductive layer and a third conductive layer in order toward the barrier layer BL.

Within the pixel electrode PXSE, each of the first conductive layer, the second conductive layer and the third conductive layer has a hydrogen concentration. The hydrogen (H) concentration of the third laminated conductive layer SC3 may be greater than the H concentration of the first laminated conductive layer SC1. As will be described later, the third laminated conductive layer SC3 may be doped with H (e.g., hydrogen-doped) to dope part of the barrier layer BL with an n+ dopant, and even if H diffuses into the barrier layer BL from the third laminated conductive layer SC3, at least some H may still remain in the third laminated conductive layer SC3.

The pixel-defining film PDL and the barrier layer BL may be disposed on the pixel electrode PXSE. The pixel-defining film PDL has already been described above, and thus, a detailed description thereof will be omitted.

The barrier layer BL may be optically transparent. The barrier layer BL may have a transmittance of about 50% to about 99%, such as about 80% to 99%, but the invention is not limited thereto. As a result, even if the barrier layer BL is disposed between the emission layer EML and the pixel electrode PXSE, light emitted from the emission layer EML toward the pixel electrode PXSE may pass through the barrier layer BL and may be reflected by the pixel electrode PXSE to proceed toward the top (or the front surface) of the display device 1.

The barrier layer BL may include a material having a higher work function than the common electrode CME. As a result, even if the barrier layer BL is disposed between the emission layer EML and the pixel electrode PXSE, the emission layer EML can properly operate and emit light.

The barrier layer BL may include first and second areas LRA and HRA, which have different electrical resistances from each other. The first area LRA may have a lower electrical resistance than the second area HRA. For convenience, the first area LRA will hereinafter be referred to as a low-resistance area LRA, and the second area HRA will hereinafter be referred to as a high-resistance area HRA.

The low-resistance area LRA may not overlap with the pixel-defining film PDL in the thickness direction (or the third direction DR3), and the high-resistance area HRA may overlap with (or correspond to) a solid portion of the pixel-defining film PDL in the thickness direction (or the third direction DR3). That is, the low-resistance area LRA may correspond to the pixel opening which is defined by solid portions of the pixel-defining film PDL. The low-resistance area LRA may be disposed in an emission area EMA (see FIG. 4) of the first subpixel PXS_1, and the high-resistance area HRA may be disposed in a non-emission area NEM of the first subpixel PXS_1. Also, the low-resistance area LRA may be disposed in a light-transmission area TA (see FIG. 4) of the first subpixel PXS_1, and the high-resistance area HRA may be disposed in a light-blocking area BA (see FIG. 4) of the first subpixel PXS_1.

The low-resistance area LRA may be disposed on or corresponding to the pixel electrode PXSE. The low-resistance area LRA may cover part of the pixel electrode PXSE exposed to outside the pixel-defining film PDL. The low-resistance area LRA may cover an entirety of an exposed portion of the pixel electrode PXSE which is exposed by the pixel opening in the pixel-defining film PDL, but the invention is not limited thereto. The low-resistance area LRA may overlap with the pixel electrode PXSE in the thickness direction (or the third direction DR3). The low-resistance area LRA may overlap with the part of the pixel electrode PXSE exposed by the pixel-defining film PDL, in the thickness direction (or the third direction DR3), but the invention is not limited thereto. Alternatively, the low-resistance area LRA may overlap with the pixel electrode PXSE in the thickness direction (or the third direction DR3)

with the pixel-defining film PDL interposed therebetween. At least part of the low-resistance area LRA may be in direct contact with the pixel electrode PXSE, but the invention is not limited thereto.

The high-resistance area HRA may be disposed on the pixel-defining film PDL. The high-resistance area HRA may be disposed on the top surface and extend from the top surface along the sides (e.g., side surfaces) of the pixel-defining film PDL. The high-resistance area HRA may cover the top surface and the sides of the pixel-defining film PDL. The high-resistance area HRA may cover an entirety of the top surface and an entirety of the sides of the pixel-defining film PDL, but the invention is not limited thereto. The high-resistance area HRA may overlap with the pixel electrode PXSE in the thickness direction (or the third direction DR3) with the pixel-defining film PDL interposed therebetween. The high-resistance area HRA may be in direct contact with the top surface and the sides of the pixel-defining film PDL, but the invention is not limited thereto.

The high-resistance area HRA may surround the low-resistance area LRA in a plan view. That is, the low-resistance area LRA, which is disposed on the pixel electrode PXSE, may be isolated by the high-resistance area HRA.

The electrical resistance (hereinafter "resistance") of the low-resistance area LRA may be lower than the resistance of the high-resistance area HRA. In an embodiment, the low-resistance area LRA may have a resistance of about 1 Ohm ($\Omega$) to about 999 Ohms ($\Omega$) or about 10 $\Omega$ to about 99$\Omega$, but the invention is not limited thereto. In an embodiment, the high-resistance area HRA may have a resistance of about 100 megaohms (Me) to about 100000 Me (or 100 gigaohms (G$\Omega$)) or 1000 M$\Omega$ (or 1 G$\Omega$) to 10000 Me (or 10 G$\Omega$), but the invention is not limited thereto.

Thus, even though the low-resistance area LRA of the barrier layer BL is disposed between the pixel electrode PXSE and the emission layer EML, an electrical current can be properly transmitted from the pixel electrode PXSE to the emission layer EML. Therefore, even though the barrier layer BL is further provided, each subpixel PXS (see FIG. 3) can be smoothly driven.

Also, as the high-resistance area HRA has a higher resistance than the low-resistance area LRA and is disposed to surround the low-resistance area LRA, the transmission of an electrical current from the pixel electrode PXSE to another pixel electrode PXSE can be suppressed or prevented, and as a result, the reliability of the display device 1 can be improved.

The barrier layer BL may include, for example, an oxide semiconductor, but the invention is not limited thereto. Here, the oxide semiconductor may include at least one of the aforementioned materials for forming the semiconductor layer ACT. The barrier layer BL will hereinafter be described as including IGZO, but the invention is not limited thereto. The barrier layer BL may include a material other than the oxide semiconductor.

In a case where the barrier layer BL includes IGZO, the In, Ga, Zn, and oxygen (O) contents of the barrier layer BL may be about 10 atomic percent (at %) to about 35 at %, but the invention is not limited thereto. The barrier layer BL may have an In—Ga—Zn—O composition ratio of 1:1:1:1. In this case, the resistance of the low-resistance area LRA may be low enough to transmit an electrical current from the pixel electrode PXSE to the emission layer EML, and the resistance of the high-resistance area HRA may be high enough not to transmit an electrical current that flows in the low-resistance area LRA to a neighboring subpixel PXS.

The low-resistance area LRA and the high-resistance area HRA may include amorphous IGZO, and the low-resistance area LRA may further include crystallized IGZO (e.g., crystalline indium gallium zinc oxide). In other words, at least part of the low-resistance area LRA may be crystallized. At least part of the low-resistance area LRA may include impurities. An n+ or p+ dopant may be injected into at least part of the low-resistance area LRA so that the low-resistance area LRA may be doped with the n+ or p+ dopant. In an embodiment, the low-resistance area LRA may be n+-doped with H (e.g., hydrogen-doped).

The low-resistance area LRA may be doped by the third laminated conductive layer SC3 of the pixel electrode PXSE. As will be described later, the third laminated conductive layer SC3 may be doped with H before the formation of the barrier layer BL in a method of providing the display device 1. After the formation of the barrier layer BL, H may diffuse into the barrier layer BL due to thermal treatment, and as a result, a low-resistance area LRA n+-doped with H may be formed.

In a case where the low-resistance area LRA is doped with H, the H concentration of the low-resistance area LRA may be two to thirty times or five to ten times greater than the H concentration of the high-resistance area HRA, but the invention is not limited thereto.

The H concentration of the low-resistance area LRA may be 2.0E+21 atoms per cubic centimeter (atoms/cm$^3$) to 3.0E+21 atoms/cm$^3$ or 5.0E+20 atoms/cm$^3$ to 1.0E+22 atoms/cm$^3$, but the invention is not limited thereto. The H concentration of the high-resistance area HRA may be 3.0E+20 atoms/cm$^3$ to 4.0E+20 atoms/cm$^3$ or 5.0E+19 atoms/cm$^3$ to 1.0E+21 atoms/cm$^3$, but the invention is not limited thereto.

As the low-resistance area LRA of the barrier layer BL is disposed on the pixel electrode PXSE and covers the pixel electrode PXSE, the infiltration of sulfur (S) from the outside into the pixel electrode PXSE can be suppressed or prevented. Thus, in a case where the pixel electrode PXSE includes Ag, S from the outside can be suppressed or prevented from infiltrating into the second laminated conductive layer SC2 to react with Ag and thus to form Ag$_2$S. Also, a short circuit between the pixel electrode PXSE and the common electrode CME that may be caused by the formation of Ag$_2$S can be suppressed or prevented. Accordingly, defects such as dark spots can be suppressed or prevented, and as a result, the reliability of the display device 1 can be improved.

In a case where the pixel-defining film PDL includes S, the high-resistance area HRA of the barrier layer BL is disposed on a solid portion of the pixel-defining film PDL and covers the pixel-defining film PDL. Thus, the release of S from the pixel-defining film PDL can be suppressed or prevented, and the diffusion of S from the pixel-defining film PDL into the emission layer EML can be suppressed or prevented. Accordingly, the diffusion of S from the pixel-defining film PDL into the first, second, and third charge generation layers CGL1, CGL2, and CGL3 of the emission layer EML can be suppressed or prevented. Also, the degradation of the functions of the first, second, and third charge generation layers CGL1, CGL2, and CGL3 that may be caused by the diffusion of S from the pixel-defining film PDL into the first, second, and third charge generation layers CGL1, CGL2, and CGL3 can be suppressed or prevented. Therefore, defects such as pixel shrinkage can be suppressed or prevented, and the reliability of the display device 1 can be improved.

That is, as the barrier layer BL is provided, defects such as dark spots or pixel shrinkage can be suppressed or prevented. Also, as the barrier layer BL includes the low- and high-resistance areas LRA and HRA, which have different resistances, each subpixel PXS can properly operate, even though the barrier layer BL is disposed between the pixel electrode PXSE and the emission layer EML, the driving of any undesignated subpixel PXS can be suppressed or prevented, and the reliability of the display device 1 can be improved.

The emission layer EML, the common electrode CME, and the thin-film encapsulation structure 170 are illustrated as disposed on the barrier layer BL. The elements disposed on the pixel electrode PXSE have already been described above, and thus, detailed descriptions thereof will be omitted.

A method of manufacturing (or providing) a display device 1 will hereinafter be described.

Figure 8:
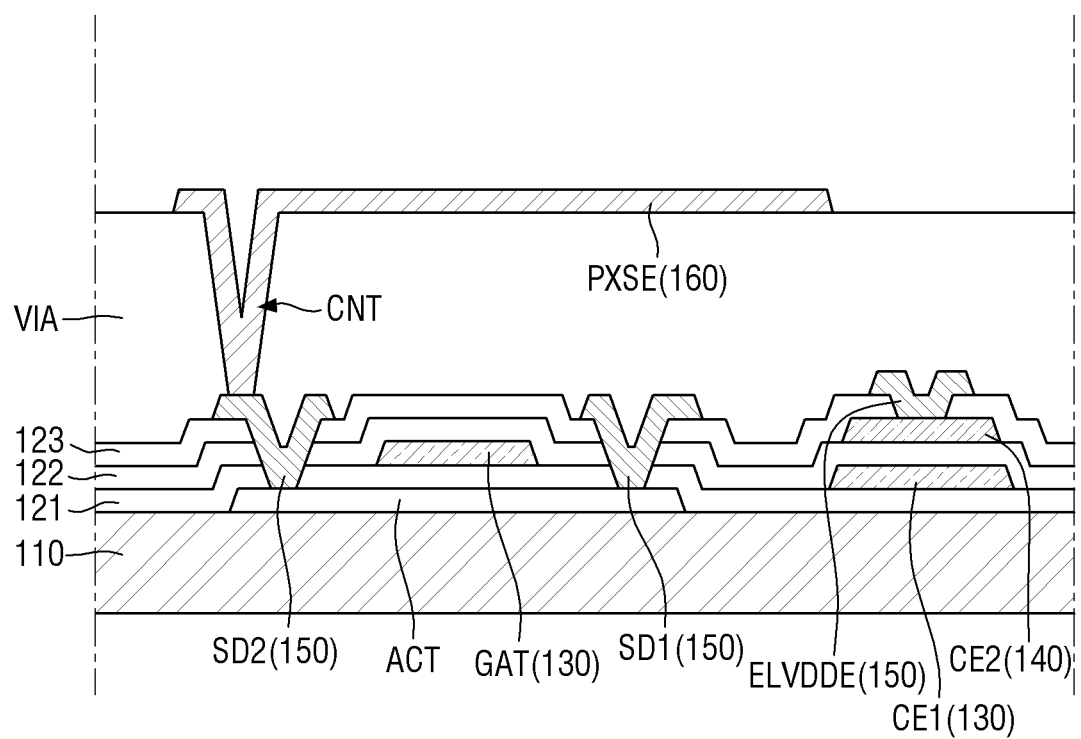
FIGS. 8 through 13 are cross-sectional views illustrating an embodiment of a method of providing a display device.
Figure 9:
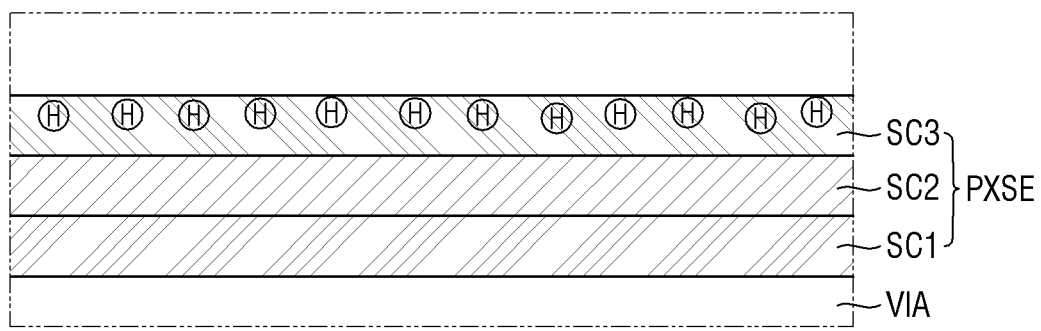
Figure 10:
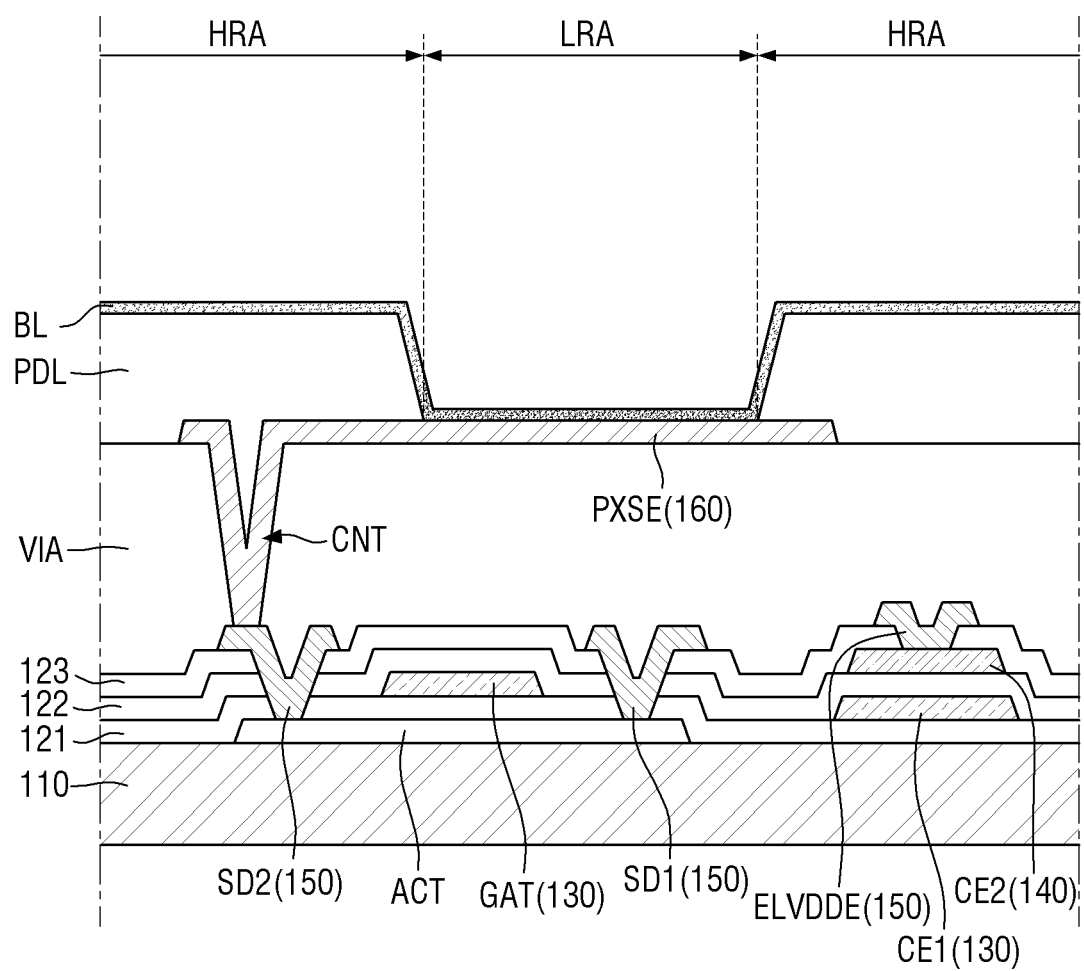
Figure 11:
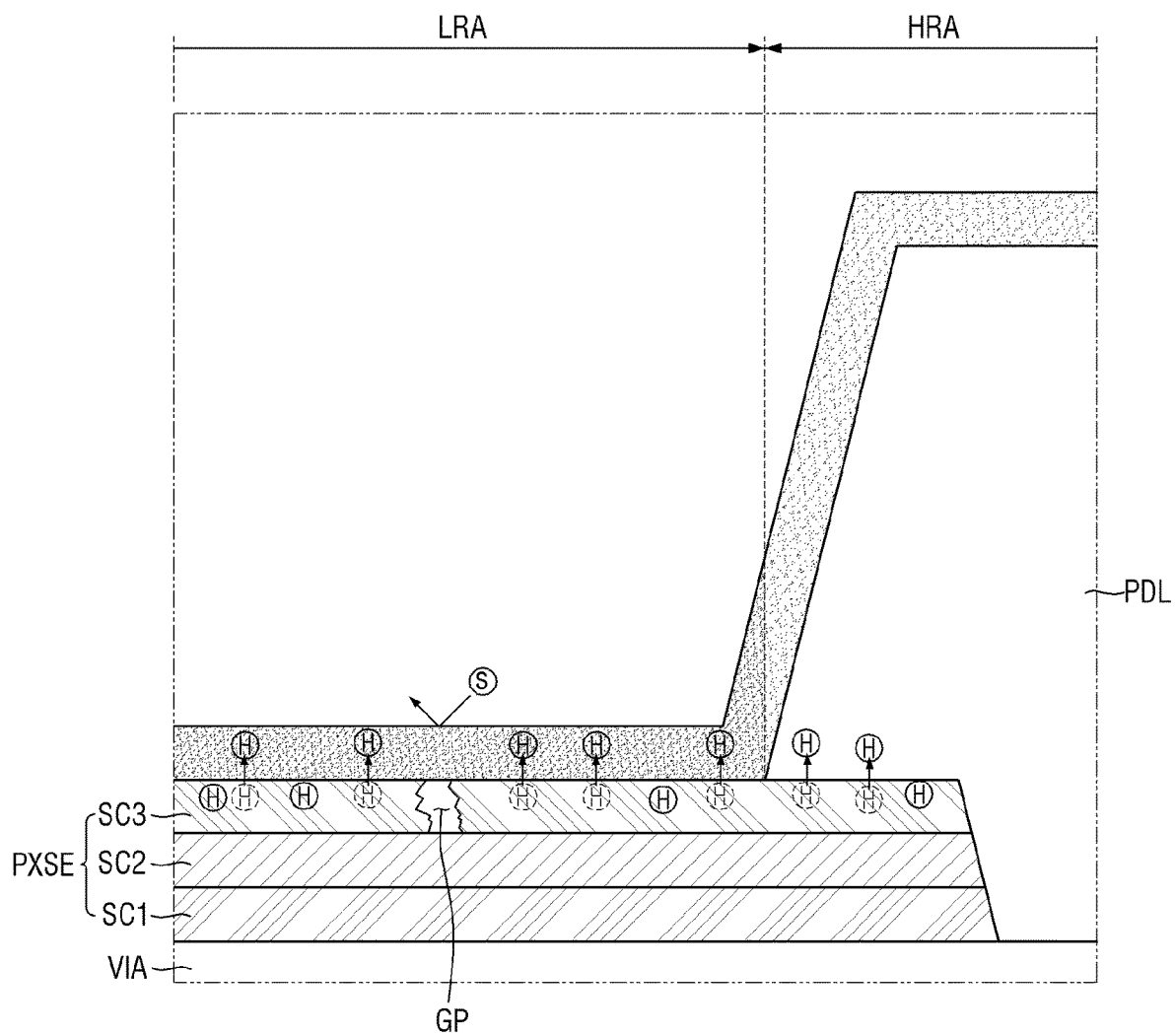
Figure 12:
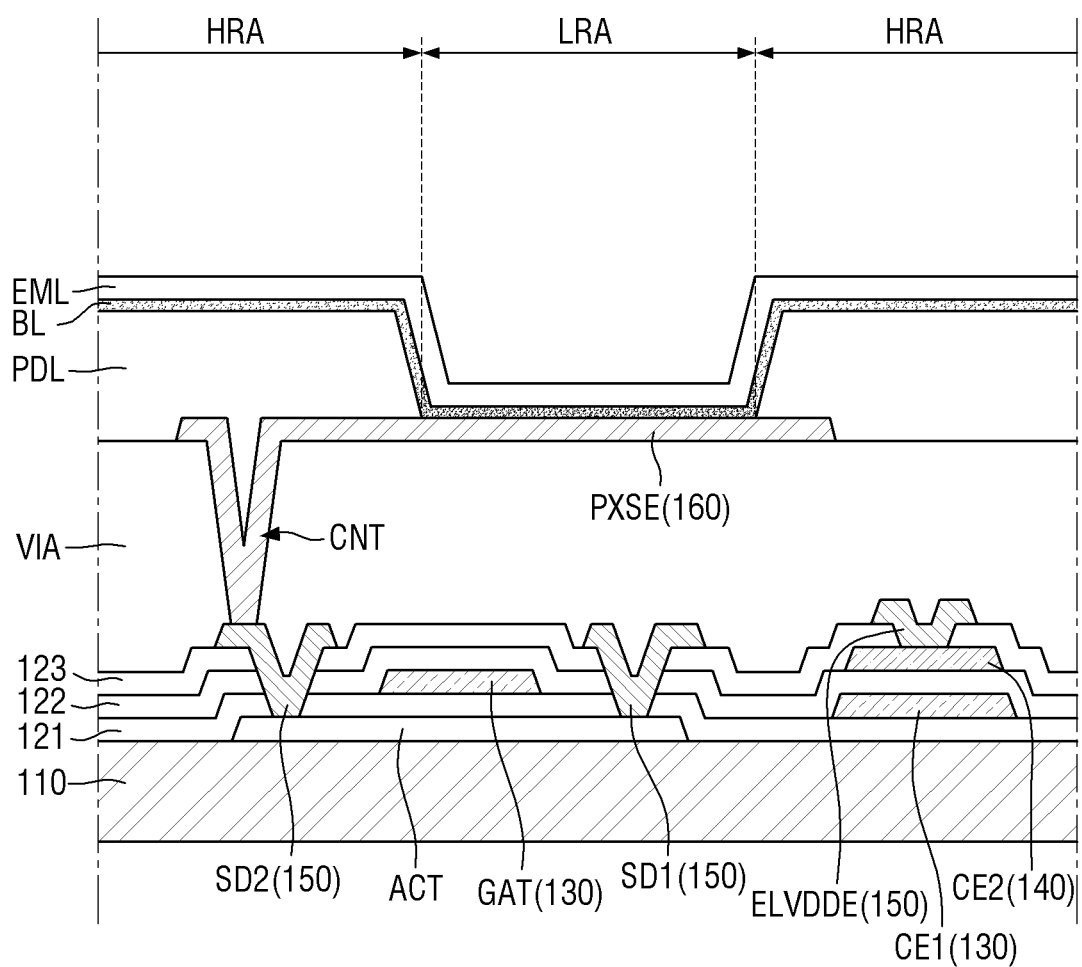
Figure 13:
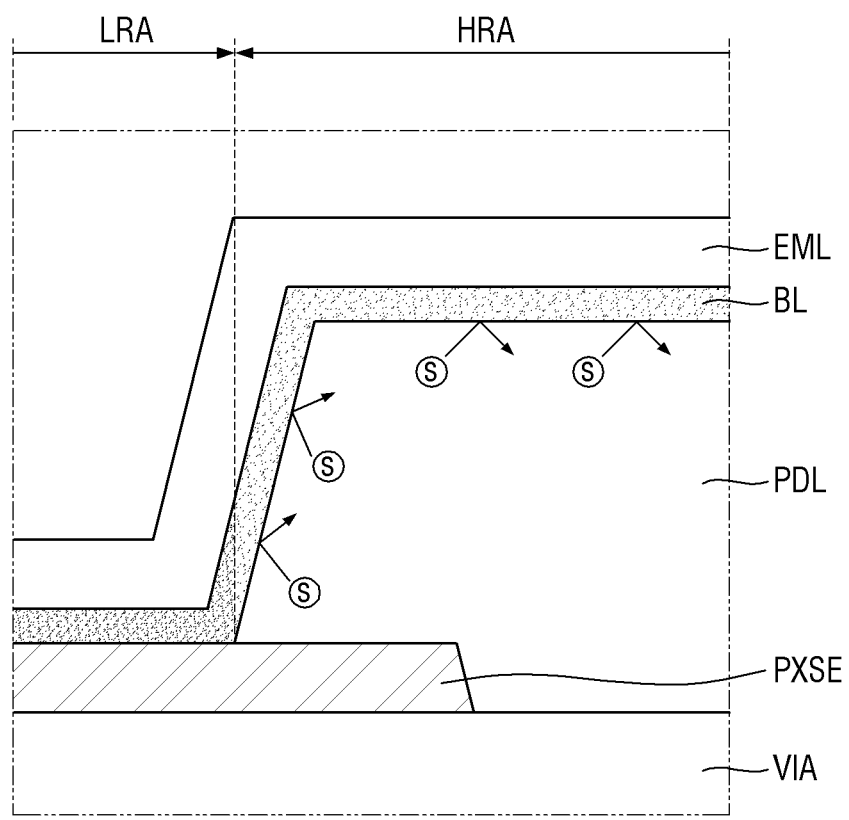

FIGS. 8 through 13 are cross-sectional views illustrating an embodiment of a method of manufacturing (or providing) a display device 1. FIGS. 8 through 13 are cross-sectional views of a first display substrate 10. FIG. 9 is an enlarged cross-sectional view illustrating an embodiment of a pixel electrode PXSE of FIG. 8 and an area adjacent to the pixel electrode PXSE, and FIG. 11 is an enlarged cross-sectional view illustrating an embodiment of a pixel electrode PXSE of FIG. 10 and an area adjacent to the pixel electrode PXSE. FIG. 13 is an enlarged cross-sectional view illustrating an embodiment of a pixel-defining film PDL of FIG. 12 and an adjacent area of the pixel-defining film PDL.

Referring to FIGS. 8 and 9, a circuit layer (e.g., a semiconductor layer ACT, a first insulating layer 121, a first gate conductive layer 130, a second insulating layer 122, a second gate conductive layer 140, a third insulating layer 123, and a first data conductive layer 150) is formed (or provided) on a first substrate 110, and then, a pixel electrode PXSE is formed.

Before the formation of the pixel electrode PXSE, a via layer VIA including a first contact hole CNT defined therein may be formed. The via layer VIA may include an organic material containing a photosensitive material, in which case, a first contact hole CNT, which exposes a second terminal electrode SD2 of a thin-film transistor to outside the via layer VIA, may be formed by applying a via layer material layer for forming the via layer VIA and subjecting the via layer material layer to an exposure and development process.

The pixel electrode PXSE may be formed by forming a pixel electrode material layer for forming the pixel electrode PXSE on the entire first substrate 110 and patterning the pixel electrode material layer. The pixel electrode material layer may be formed by a deposition process and may be patterned by a mask process. Also, during the deposition of the pixel electrode material layer, the pixel electrode material layer may be deposited even on the inside of the first contact hole CNT and may thus be in contact with the second terminal electrode SD2.

After the patterning of the pixel electrode PXSE, a portion of the pixel electrode PXSE may be doped with H to provide a third laminated conductive layer SC3 of the pixel electrode PXSE. The doping of the portion of the pixel electrode PXSE to provide the third laminated conductive layer SC3 may be performed by ion implantation, but the invention is not limited thereto. In an embodiment, the method may include providing a pixel-defining layer which is on the pixel electrode PXSE which has the hydrogen-doped layer (e.g., third laminated conductive layer SC3) and exposes a portion of the pixel electrode PXSE to outside the pixel-defining layer to define an exposed portion of the pixel electrode PXSE which has the hydrogen-doped layer.

Thereafter, referring to FIGS. 10 and 11, a pixel-defining film PDL and a barrier layer BL are formed on the pixel electrode PXSE having the third laminated conductive layer SC3 doped with H.

The pixel-defining film PDL may be formed of, for example, an organic material including a photosensitive material. In this case, the pixel-defining film PDL, which is patterned, may be formed by applying a pixel-defining film organic material layer for forming the pixel-defining film PDL and subjecting the pixel-defining film organic material layer to exposure and development. The pixel-defining film PDL may be formed along the boundaries of each subpixel PXS and may partially overlap with the pixel electrode PXSE. The pixel-defining film PDL may be formed to overlap with the first contact hole CNT. In a case where the pixel electrode PXSE fills the first contact hole CNT only partially, the pixel-defining film PDL may completely fill the first contact hole CNT.

The barrier layer BL may be formed on the pixel-defining film PDL and a part of the pixel electrode PXSE which is exposed by the pixel opening in the pixel-defining film PDL to outside the pixel-defining film PDL. In a case where the barrier layer BL includes IGZO, the barrier layer BL may be formed by physical vapor deposition ("PVD"), particularly, sputtering, but the invention is not limited thereto. The In—Ga—Zn—O content ratio of IGZO may be controlled by controlling the partial pressure of O during sputtering. Alternatively, the barrier layer BL may be formed by chemical vapor deposition ("CVD").

After the formation of the barrier layer BL, thermal treatment may be performed. As a result, at least some of the doped H within the third laminated conductive layer SC3 of the pixel electrode PXSE may diffuse into the barrier layer BL, particularly, part of the barrier layer BL which is in direct contact with the third laminated conductive layer SC3, e.g., a low-resistance area LRA. The H from the third laminated conductive layer SC3 may not diffuse at all, or may diffuse, but only slightly, into part of the barrier layer BL spaced apart from the third laminated conductive layer SC3 by the pixel-defining film PDL, e.g., a high-resistance area HRA. In an embodiment, the method may include providing a hydrogen-doped portion of the barrier layer BL which corresponds to the pixel electrode PXSE of the light-emitting element by diffusing hydrogen from the hydrogen-doped layer of the pixel electrode PXSE into the barrier layer BL by a thermal treatment, the providing the hydrogen-doped portion defining within the barrier layer BL a first area LRA which corresponds to the hydrogen-doped portion and has an electrical resistance, and a second area HRA which extends from the first area LRA, corresponds to the pixel-defining layer and has an electrical resistance which is higher than the first area LRA.

Accordingly, low- and high-resistance areas LRA and HRA within the barrier layer BL having different resistances may be formed. That is, the low-resistance area LRA may be an area doped with H diffused from the third laminated conductive layer SC3 of the pixel electrode PXSE and may have a lower resistance than the high-resistance area HRA. The high-resistance area HRA may be an area that the H from the third laminated conductive layer SC3 does not diffuse at all, or diffuses, but only slightly, into and may have a higher resistance than the low-resistance area LRA.

Due to the H diffused from the third laminated conductive layer SC3 of the pixel electrode PXSE, at least part of the barrier layer BL (e.g., the low-resistance area LRA) may be n+-doped, and the resistance of the low-resistance area LRA may decrease. As a result, even if an emission layer EML is disposed on the low-resistance area LRA of the barrier layer BL, the low-resistance area LRA of the barrier layer BL can properly transmit an electrical current from the pixel electrode PXSE to the emission layer EML, and as a result, each subpixel PXS can properly operate.

Alternatively, some of the doped H within the third laminated conductive layer SC3 may diffuse into the pixel-defining film PDL. In this case, the H concentration of the pixel-defining film PDL may increase at a portion close to the third laminated conductive layer SC3 and may decrease in a direction away from the third laminated conductive layer SC3, but the invention is not limited thereto.

Before the formation of the emission layer EML, at least part of the barrier layer BL may be plasma-treated with nitrogen dioxide ($N_2O_2$). In a case where the low-resistance area LRA of the barrier layer BL is plasma-treated, n+ doping may be additionally performed. As a result, the resistance of the low-resistance area LRA may further decrease.

Thereafter, the pixel-defining film PDL may be subjected to exposure and development and to thermal curing. As a result, at least part of the third laminated conductive layer SC3 of the pixel electrode PXSE may be crystallized. A pin hole GP may be formed in the crystallized part of the third laminated conductive layer SC3, and as a result, a second laminated conductive layer SC2 of the pixel electrode PXSE may be exposed to outside the third laminated conductive layer SC3. Even if the pin hole GP is formed in the third laminated conductive layer SC3 of the pixel electrode PXSE, the barrier layer BL may cover the pin hole GP and may thus reduce or effectively prevent impurities such as S from the outside from infiltrating into the second laminated conductive layer SC2. That is, the pixel electrode PXSE may be protected from impurities such as S from the outside by providing the barrier layer BL on the pixel electrode PXSE. At least part of the barrier layer BL may be disposed in the pin hole GP, but the invention is not limited thereto. Impurities such as S may float in a chamber or may be included in an organic layer for protecting the pixel electrode PXSE, but the invention is not limited thereto.

In a case where the second laminated conductive layer SC2 includes Ag, the barrier layer BL may suppress or prevent S from the outside from infiltrating into the second laminated conductive layer SC2 to react with Ag and thus to form $Ag_2S$. Also, due to the presence of the barrier layer BL, a short circuit between the pixel electrode PXSE and a common electrode CME that may be caused by the formation of $Ag_2S$ can be suppressed or prevented. Accordingly, defects such as dark spots can be suppressed or prevented, and as a result, the reliability of a display device 1 can be improved.

Thereafter, referring to FIGS. 12 and 13, the emission layer EML is formed on the barrier layer BL. The aforementioned layers of the emission layer EML may be sequentially formed by at least one of a vacuum deposition method, a spin coating method, a cast method, a Langmuir-Blodgett method, an inkjet printing method, a laser printing method, and a laser-induced thermal imaging ("LITI") method, but the invention is not limited thereto.

At least part of the barrier layer BL may be disposed between the emission layer EML and the pixel-defining film PDL. In a case where the pixel-defining film PDL includes S, the barrier layer BL can block the diffusion of S into the emission layer EML. As a result, any defects that may be caused by the concentration of S in the first, second, and third charge generation layers CGL1, CGL2, and CGL3 (see FIG. 5), such as the deterioration of the functions of first, second, and third charge generation layers CGL1, CGL2, and CGL3 (see FIG. 3), can be suppressed or prevented. Thus, the deterioration of the characteristics of the emission layer EML can be suppressed or prevented, and defects such as pixel shrinkage can also be suppressed or prevented.

Further embodiments will hereinafter be described, focusing mainly on the differences with the previous embodiments. Descriptions of elements or features that have already been described above will be omitted or simplified.

Figure 14:
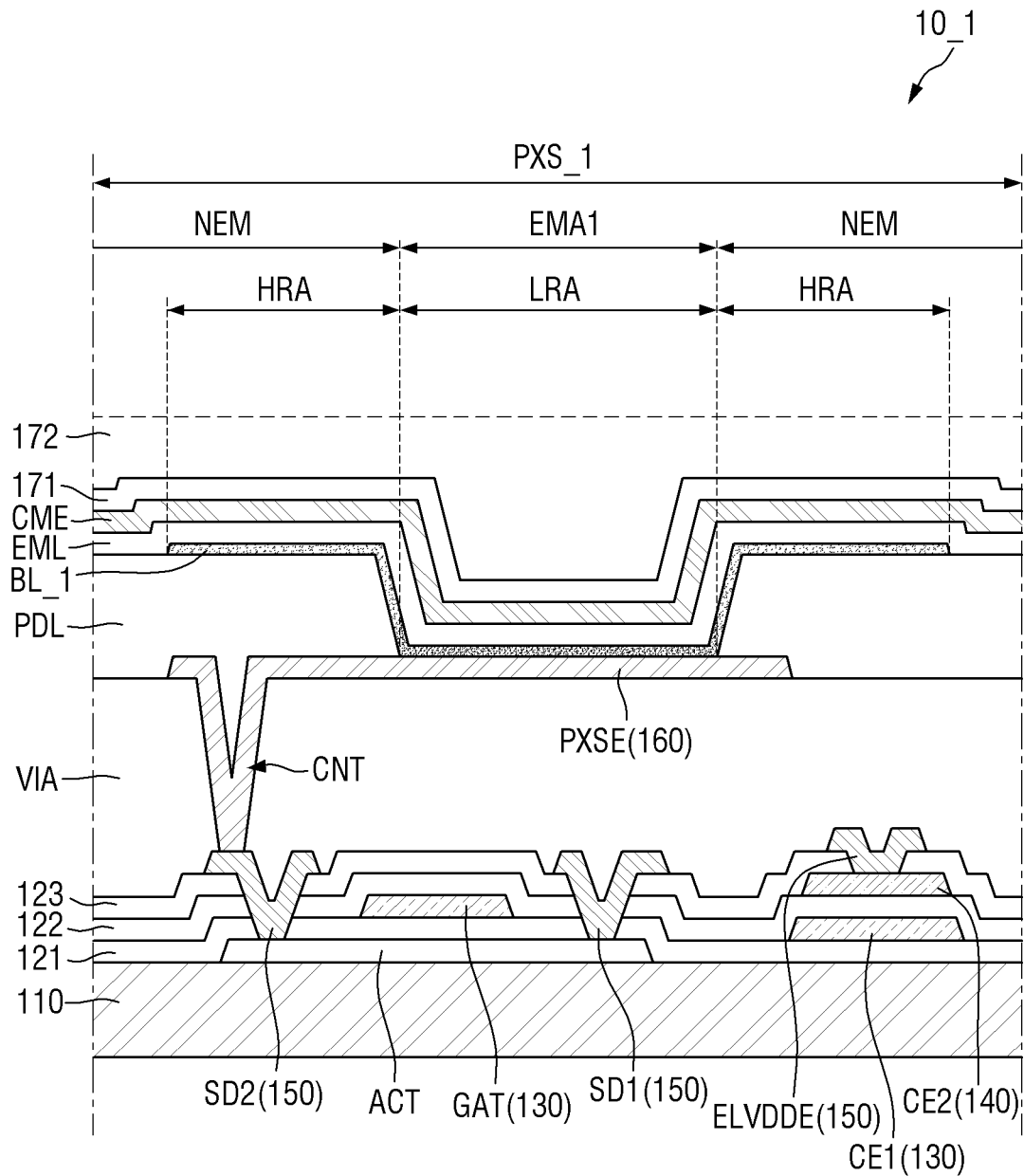
FIG. 14 is a cross-sectional view of an embodiment of a display device.

FIG. 14 is a cross-sectional view of an embodiment of a display device 1. FIG. 14 illustrates a cross section of a first display substrate 10_1 of a display device 1.

The embodiment of FIG. 14 differs from the embodiment of FIG. 6 in that a plurality of barrier layers BL_1 (e.g., barrier layer pattern provided in plural) are provided and are disposed in different subpixels PXS (see FIG. 3).

Referring to FIG. 14, a barrier layer BL_1 provided in plural including a plurality of barrier layers BL_1 may be provided and may be isolated from one another in a direction along a pixel-defining film PDL. That is, the barrier layers BL_1 may have an island shape in a plan view. The pixel-defining film PDL may extend further from the pixel electrode PXSE than the barrier layer pattern (e.g., the barrier layer BL_1) to define an extended portion of the pixel-defining film PDL. The extended portion of the pixel-defining film PDL corresponds to the non-emission area NEM. The barrier layers BL_1 may be disposed in different subpixels PXS (see FIG. 3). Each of the barrier layers BL_1 may include a low-resistance area LRA and a high-resistance area HRA. The barrier layers BL_1 may expose the pixel-defining film PDL to outside the barrier layers BL_1. Parts of the pixel-defining film PDL that are exposed by the barrier layers BL_1 (e.g., exposed portions) may be disposed along or correspond to the boundaries of each subpixel PXS.

Even if the pixel-defining film PDL is partially exposed so that S from the pixel-defining film PDL diffuses into an emission layer EML, defects such as pixel shrinkage may not occur because the exposed parts of the pixel-defining film PDL are disposed in non-emission areas NEM.

Even in this case, defects such as dark spots and pixel shrinkage can be suppressed or prevented by the barrier layers BL_1. Also, as the barrier layers BL_1 are isolated from one another, any interference between neighboring subpixels PXS can be properly suppressed or prevented.

Figure 15:
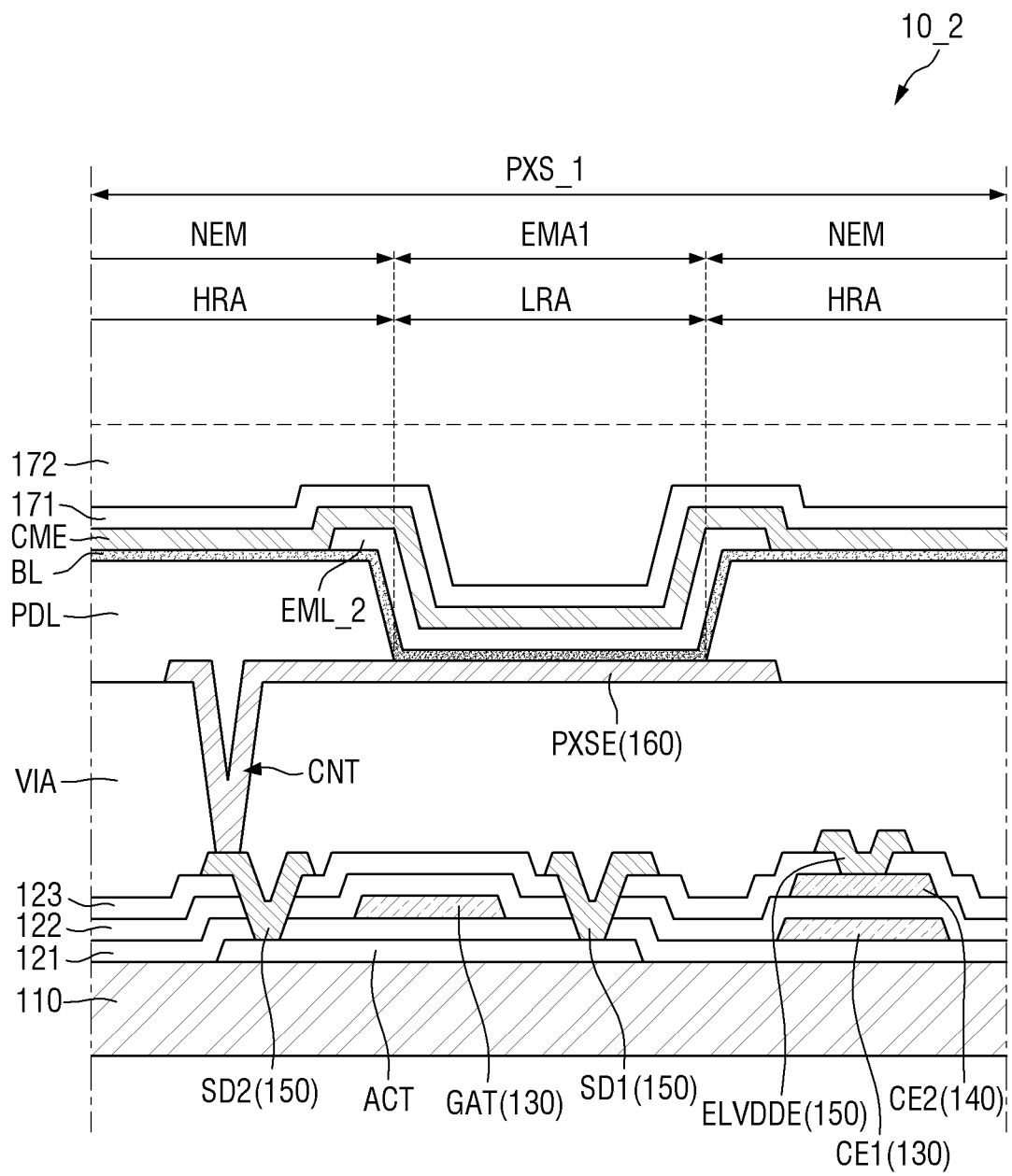
FIG. 15 is a cross-sectional view of an embodiment of a display device.

FIG. 15 is a cross-sectional view of an embodiment of a display device 1. FIG. 15 illustrates a cross section of an embodiment of a first display substrate 10_2 of a display device 1.

The embodiment of FIG. 15 differs from the embodiment of FIG. 6 in that a plurality of emission layers EML_2 (e.g., emission layer pattern provided in plural) are provided and are disposed in different subpixels PXS (see FIG. 3).

Referring to FIG. 15, an emission layer EML_2 provided in plural including a plurality of emission layers EML_2 may be provided and may be isolated from one another in a direction along a pixel-defining film PDL. That is, the emission layers EML_2 may have an island shape in a plan view. The barrier layer BL may extend further from the pixel electrode PXSE than the emission layer pattern (e.g., the emission layer EML_2) to define an extended portion of the barrier layer BL. The extended portion of the barrier layer BL corresponds to the non-emission area NEM. The emission layers EML_2 may be disposed in different subpixels PXS (see FIG. 3).

The emission layers EML_2 of different subpixels PXS may emit light of different colors. In an embodiment, first, second, and third subpixels PXS_1, PXS_2, and PXS_3 (see FIG. 3) of one pixel PX (see FIG. 3) may emit blue light, red light, and green light, respectively, but the invention is not limited thereto. In a case where the emission layers EML_2 of different subpixels PXS emit light of different colors, the second display substrate 20 of FIG. 4 may be omitted.

Even in this case, defects such as dark spots and pixel shrinkage can be suppressed or prevented by the barrier layer BL. Also, as the second display substrate 20 of FIG. 4 can be omitted, display devices of various structures can be provided.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
   a light-emitting element comprising:
     a pixel electrode including silver,
     a common electrode facing the pixel electrode, and
     an emission layer between the pixel electrode and the common electrode,
   a pixel-defining layer which is between the pixel electrode and the emission layer and exposes the pixel electrode to outside the pixel-defining layer; and
   a barrier layer which is between the pixel-defining layer and the emission layer, the barrier layer comprising:
     a low-resistance area corresponding to the pixel electrode and having an electrical resistance, and
     a high-resistance area extended from the low-resistance area, corresponding to the pixel-defining layer and having an electrical resistance which is higher than the electrical resistance of the low-resistance area.

2. The display device of claim 1, wherein the barrier layer includes indium gallium zinc oxide or indium tin zinc oxide.

3. The display device of claim 2, wherein
   the low-resistance area and the high-resistance area of the barrier layer include amorphous indium gallium zinc oxide, and
   the low-resistance area of the barrier layer further includes crystalline indium gallium zinc oxide.

4. The display device of claim 3, wherein the low-resistance area of the barrier layer is a hydrogen-doped area of the barrier layer.

5. The display device of claim 1, wherein the low-resistance area of the barrier layer is in direct contact with the pixel electrode of the light-emitting element.

6. The display device of claim 5, wherein the low-resistance area of the barrier layer is between the pixel electrode and the emission layer of the light-emitting element.

7. The display device of claim 1, wherein the light-emitting element further comprises the emission layer having a tandem structure including a first emission layer which emits light of a first color, a second emission layer which faces the first emission layer and emits light of a second color different from the first color, and a charge generation layer which is between the first emission layer and the second emission layer.

8. The display device of claim 7, wherein the first and second colors are blue and green, respectively.

9. The display device of claim 1, wherein
   the pixel-defining layer which is between the pixel electrode and the emission layer of the light-emitting element includes sulfur, and
   the high-resistance area of the barrier layer is between the emission layer and the pixel-defining layer which includes sulfur.

10. The display device of claim 1, further comprising:
    an emission area at which light is emitted from the display device; and
    a non-emission area adjacent to the emission area,
    wherein
    the low-resistance area of the barrier layer is in the emission area, and
    the high-resistance area of the barrier layer is in the non-emission area.

11. The display device of claim 10, wherein the barrier layer which is between the pixel electrode and the emission layer of the light-emitting element is optically transparent.

12. The display device of claim 1, wherein
    the pixel electrode of the light-emitting element includes a first conductive layer, a second conductive layer and a third conductive layer in order toward the barrier layer,
    within the pixel electrode, each of the first conductive layer, the second conductive layer and the third conductive layer has a hydrogen concentration, and
    the hydrogen concentration of the third conductive layer is greater than the hydrogen concentration of the first conductive layer.

13. The display device of claim 1, further comprising:
    a plurality of pixels, and
    the barrier layer provided in plural separated from each other in a direction along the pixel-defining layer and respectively corresponding to the plurality of pixels.

14. The display device of claim 1, further comprising:
    a plurality of pixels, and
    the emission layer provided in plural separated from each other in a direction along the pixel-defining layer and respectively corresponding to the plurality of pixels.

15. A display device comprising:
    a light-emitting element comprising:
      a pixel electrode,
      a common electrode facing the pixel electrode, and
      an emission layer between the pixel electrode and the common electrode,
    a pixel-defining layer which is between the pixel electrode and the emission layer and exposes the pixel electrode to outside the pixel-defining layer; and
    a barrier layer which is between the pixel-defining layer and the emission layer, the barrier layer comprising:
      indium gallium zinc oxide or indium tin zinc oxide,
      an n+ doped first area which has an electrical resistance, and
      a second area which extends from the n+ doped first area and has an electrical resistance which is different from the electrical resistance of the n+ doped first area.

16. The display device of claim 15, wherein
    the n+ doped first area of the barrier layer corresponds to the pixel electrode of the light-emitting element, and
    the second area of the barrier layer corresponds to the pixel-defining layer.

17. The display device of claim 16, wherein the electrical resistance of the n+ doped first area of the barrier layer is lower than the electrical resistance of the second area of the barrier layer.

18. The display device of claim 17, wherein
the n+ doped first area and the second area of the barrier layer include amorphous indium gallium zinc oxide, and
the n+ doped first area of the barrier layer further includes crystalline indium gallium zinc oxide.

19. The display device of claim 15, wherein the n+ doped first area of the barrier layer is in direct contact with the pixel electrode of the light-emitting element and is between the pixel electrode and the emission layer of the light-emitting element.

20. The display device of claim 15, wherein
the light-emitting element further comprises the emission layer having a tandem structure including a first emission layer which emits light of a first color, a second emission layer which emits light of a second color different from the first color, and a charge generation layer which is between the first emission layer and the second emission layer,
the pixel-defining layer which is between the pixel electrode and the emission layer includes sulfur, and
the second area of the barrier layer is between the emission layer and the pixel-defining layer which includes sulfur.

* * * * *